United States Patent
Plotnikov

(10) Patent No.: US 10,908,898 B2
(45) Date of Patent: Feb. 2, 2021

(54) VECTOR INSTRUCTION FOR ACCUMULATING AND COMPRESSING VALUES BASED ON INPUT MASK

(71) Applicant: Intel Corporation, Santa Clara, CA (US)

(72) Inventor: Mikhail Plotnikov, Nizhny Novgorod (RU)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/474,884

(22) PCT Filed: Feb. 17, 2017

(86) PCT No.: PCT/IB2017/000330
§ 371 (c)(1),
(2) Date: Jun. 28, 2019

(87) PCT Pub. No.: WO2018/150218
PCT Pub. Date: Aug. 23, 2018

(65) Prior Publication Data
US 2019/0369992 A1    Dec. 5, 2019

(51) Int. Cl.
*G06F 9/30* (2018.01)

(52) U.S. Cl.
CPC ...... *G06F 9/30018* (2013.01); *G06F 9/30036* (2013.01); *G06F 9/30145* (2013.01); *G06F 9/30196* (2013.01)

(58) Field of Classification Search
CPC ............. G06F 9/30018; G06F 9/30036; G06F 9/30145; G06F 9/30196; G06F 9/3001; H03M 7/3066; H03M 7/3082; H03M 7/46
See application file for complete search history.

(56) References Cited

U.S. PATENT DOCUMENTS

| | | | |
|---|---|---|---|
| 5,960,171 A * | 9/1999 | Rotman | G06F 30/33 714/49 |
| 8,243,083 B1 | 8/2012 | Garland et al. | |
| 2008/0141253 A1* | 6/2008 | Luick | G06F 9/3001 718/102 |
| 2014/0122831 A1 | 5/2014 | Uliel et al. | |
| 2015/0227367 A1* | 8/2015 | Eyole-Monono | G06F 9/3887 712/7 |

FOREIGN PATENT DOCUMENTS

| | | |
|---|---|---|
| WO | 2013101227 A1 | 7/2013 |
| WO | 2015118299 A1 | 8/2015 |
| WO | 2018182445 A1 | 10/2018 |

OTHER PUBLICATIONS

International Search Report and Written Opinion for Application No. PCT/IB2017/000330, dated Oct. 27, 2017, 15 pages.

* cited by examiner

*Primary Examiner* — Farley Abad
(74) *Attorney, Agent, or Firm* — Nicholson, De Vos, Webster & Elliott, LLP

(57) ABSTRACT

A processor includes a decode circuit to decode an instruction into a decoded instruction and an execution circuit to execute the decoded instruction to sum one or more values of one or more contiguous elements of an input vector that form a block to produce an accumulated value for the block and store the accumulated value for the block in a destination vector, where an input mask dictates the one or more contiguous elements of the input vector that form the block.

23 Claims, 22 Drawing Sheets

---

DECODE AN INSTRUCTION INTO A DECODED INSTRUCTION (910)

EXECUTE THE DECODED INSTRUCTION TO SUM ONE OR MORE VALUES OF ONE OR MORE CONTIGUOUS ELEMENTS OF AN INPUT VECTOR THAT FORM A BLOCK TO PRODUCE AN ACCUMULATED VALUE FOR THE BLOCK AND STORE THE ACCUMULATED VALUE FOR THE BLOCK IN A DESTINATION VECTOR, WHERE AN INPUT MASK DICTATES THE ONE OR MORE CONTIGUOUS ELEMENTS THAT FORM THE BLOCK (920)

| | 7 | 6 | 5 | 4 | 3 | 2 | 1 | 0 | OFFSET |
|---|---|---|---|---|---|---|---|---|---|
| | D | C | C | B | B | A | A | A | ZMM_VALUE |

| 7 | 6 | 5 | 4 | 3 | 2 | 1 | 0 | |
|---|---|---|---|---|---|---|---|---|
| 0 | 0 | 0 | 0 | 0 | 1 | 1 | 1 | ZMM1=VCONFLICT_SQR(ZMM_VALUE) |
| 0 | 0 | 0 | 0 | 0 | 1 | 1 | 1 | |
| 0 | 0 | 0 | 0 | 0 | 1 | 1 | 1 | |
| 0 | 0 | 0 | 1 | 1 | 0 | 0 | 0 | |
| 0 | 0 | 0 | 1 | 1 | 0 | 0 | 0 | |
| 0 | 1 | 1 | 0 | 0 | 0 | 0 | 0 | |
| 0 | 1 | 1 | 0 | 0 | 0 | 0 | 0 | |
| 1 | 0 | 0 | 0 | 0 | 0 | 0 | 0 | |

| 7 | 6 | 5 | 4 | 3 | 2 | 1 | 0 | |
|---|---|---|---|---|---|---|---|---|
| 0 | 0 | 0 | 0 | 0 | 0 | 0 | 0 | ZMM_MASK_LEFT |
| 0 | 0 | 0 | 0 | 0 | 0 | 0 | 1 | |
| 0 | 0 | 0 | 0 | 0 | 0 | 1 | 0 | |
| 0 | 0 | 0 | 0 | 0 | 1 | 0 | 0 | |
| 0 | 0 | 0 | 0 | 1 | 0 | 0 | 0 | |
| 0 | 0 | 0 | 1 | 0 | 0 | 0 | 0 | |
| 0 | 0 | 1 | 0 | 0 | 0 | 0 | 0 | |
| 0 | 1 | 0 | 0 | 0 | 0 | 0 | 0 | |

| 7 | 6 | 5 | 4 | 3 | 2 | 1 | 0 | |
|---|---|---|---|---|---|---|---|---|
| 0 | 0 | 0 | 0 | 0 | 0 | 0 | 0 | ZMM2=VPAND(ZMM1, ZMM_MASK_LEFT) |
| 0 | 0 | 0 | 0 | 0 | 0 | 0 | 1 | |
| 0 | 0 | 0 | 0 | 0 | 0 | 1 | 0 | |
| 0 | 0 | 0 | 0 | 0 | 0 | 0 | 0 | |
| 0 | 0 | 0 | 0 | 1 | 0 | 0 | 0 | |
| 0 | 0 | 0 | 0 | 0 | 0 | 0 | 0 | |
| 0 | 0 | 1 | 0 | 0 | 0 | 0 | 0 | |
| 0 | 0 | 0 | 0 | 0 | 0 | 0 | 0 | |

| 1 | 1 | 0 | 1 | 0 | 1 | 0 | 0 | K1=VPTESTNM(ZMM2) |
|---|---|---|---|---|---|---|---|---|
| * | * | * | * | D | C | B | A | ZMM_VAL1=VCOMPRESS(K1, ZMM_VALUE) |
| 1 | 2 | 2 | 2 | 2 | 3 | 3 | 3 | ZMM_COUNT=VPOPCNT(ZMM1) |
| * | * | * | * | 1 | 2 | 2 | 3 | ZMM_CNT1=VCOMPRESS(K1, ZMM_COUNT) |

Fig. 2

| | 7 | 6 | 5 | 4 | 3 | 2 | 1 | 0 | OFFSET |
|---|---|---|---|---|---|---|---|---|---|
| | D | C | C | B | B | A | A | A | ZMM_VALUE |

| 7 | 6 | 5 | 4 | 3 | 2 | 1 | 0 | |
|---|---|---|---|---|---|---|---|---|
| 0 | 0 | 0 | 0 | 0 | 1 | 1 | 1 | ZMM1=VCONFLICT_SQR(ZMM_VALUE) |
| 0 | 0 | 0 | 0 | 0 | 1 | 1 | 1 | |
| 0 | 0 | 0 | 0 | 0 | 1 | 1 | 1 | |
| 0 | 0 | 0 | 1 | 1 | 0 | 0 | 0 | |
| 0 | 0 | 0 | 1 | 1 | 0 | 0 | 0 | |
| 0 | 1 | 1 | 0 | 0 | 0 | 0 | 0 | |
| 0 | 1 | 1 | 0 | 0 | 0 | 0 | 0 | |
| 1 | 0 | 0 | 0 | 0 | 0 | 0 | 0 | |

| 7 | 6 | 5 | 4 | 3 | 2 | 1 | 0 | |
|---|---|---|---|---|---|---|---|---|
| 0 | 0 | 0 | 0 | 0 | 0 | 1 | 0 | ZMM_MASK_RIGHT |
| 0 | 0 | 0 | 0 | 0 | 1 | 0 | 0 | |
| 0 | 0 | 0 | 0 | 1 | 0 | 0 | 0 | |
| 0 | 0 | 0 | 1 | 0 | 0 | 0 | 0 | |
| 0 | 0 | 1 | 0 | 0 | 0 | 0 | 0 | |
| 0 | 1 | 0 | 0 | 0 | 0 | 0 | 0 | |
| 1 | 0 | 0 | 0 | 0 | 0 | 0 | 0 | |
| 0 | 0 | 0 | 0 | 0 | 0 | 0 | 0 | |

| 7 | 6 | 5 | 4 | 3 | 2 | 1 | 0 | |
|---|---|---|---|---|---|---|---|---|
| 0 | 0 | 0 | 0 | 0 | 0 | 1 | 0 | ZMM2=VPAND(ZMM1, ZMM_MASK_RIGHT) |
| 0 | 0 | 0 | 0 | 0 | 1 | 0 | 0 | |
| 0 | 0 | 0 | 0 | 0 | 0 | 0 | 0 | |
| 0 | 0 | 0 | 1 | 0 | 0 | 0 | 0 | |
| 0 | 0 | 0 | 0 | 0 | 0 | 0 | 0 | |
| 0 | 1 | 0 | 0 | 0 | 0 | 0 | 0 | |
| 0 | 0 | 0 | 0 | 0 | 0 | 0 | 0 | |
| 0 | 0 | 0 | 0 | 0 | 0 | 0 | 0 | |

| 1 | 0 | 1 | 0 | 1 | 0 | 0 | 1 | K1=VPTESTNM(ZMM2) |
|---|---|---|---|---|---|---|---|---|
| * | * | * | * | D | C | B | A | ZMM_VAL1=VCOMPRESS(K1, ZMM_VALUE) |
| 1 | 2 | 2 | 2 | 2 | 3 | 3 | 3 | ZMM_COUNT=VPOPCNT(ZMM1) |
| * | * | * | * | 1 | 2 | 2 | 3 | ZMM_CNT1=VCOMPRESS(K1, ZMM_COUNT) |

Fig. 3

|   |   |   |   |   |   |   |   |   |
|---|---|---|---|---|---|---|---|---|
| 7 | 6 | 5 | 4 | 3 | 2 | 1 | 0 | OFFSET |
| B | A | A | B | B | A | A | A | ZMM_VALUE |

| 0 | 1 | 1 | 0 | 0 | 1 | 1 | 1 | ZMM1=VCONFLICT_SQR(ZMM_VALUE) |
|---|---|---|---|---|---|---|---|---|
| 0 | 1 | 1 | 0 | 0 | 1 | 1 | 1 | |
| 0 | 1 | 1 | 0 | 0 | 1 | 1 | 1 | |
| 1 | 0 | 0 | 1 | 1 | 0 | 0 | 0 | |
| 1 | 0 | 0 | 1 | 1 | 0 | 0 | 0 | |
| 0 | 1 | 1 | 0 | 0 | 1 | 1 | 1 | |
| 0 | 1 | 1 | 0 | 0 | 1 | 1 | 1 | |
| 1 | 0 | 0 | 1 | 1 | 0 | 0 | 0 | |

| 0 | 0 | 0 | 0 | 0 | 0 | 0 | 0 | ZMM_MASK_LEFT |
|---|---|---|---|---|---|---|---|---|
| 0 | 0 | 0 | 0 | 0 | 0 | 0 | 1 | |
| 0 | 0 | 0 | 0 | 0 | 0 | 1 | 0 | |
| 0 | 0 | 0 | 0 | 0 | 1 | 0 | 0 | |
| 0 | 0 | 0 | 0 | 1 | 0 | 0 | 0 | |
| 0 | 0 | 0 | 1 | 0 | 0 | 0 | 0 | |
| 0 | 0 | 1 | 0 | 0 | 0 | 0 | 0 | |
| 0 | 1 | 0 | 0 | 0 | 0 | 0 | 0 | |

| 0 | 0 | 0 | 0 | 0 | 0 | 0 | 0 | ZMM2=VPAND(ZMM1, ZMM_MASK_LEFT) |
|---|---|---|---|---|---|---|---|---|
| 0 | 0 | 0 | 0 | 0 | 0 | 0 | 1 | |
| 0 | 0 | 0 | 0 | 0 | 0 | 1 | 0 | |
| 0 | 0 | 0 | 0 | 0 | 0 | 0 | 0 | |
| 0 | 0 | 0 | 0 | 1 | 0 | 0 | 0 | |
| 0 | 0 | 0 | 0 | 0 | 0 | 0 | 0 | |
| 0 | 0 | 1 | 0 | 0 | 0 | 0 | 0 | |
| 0 | 0 | 0 | 0 | 0 | 0 | 0 | 0 | |

| 1 | 1 | 0 | 1 | 0 | 1 | 0 | 0 | K1=VPTESTNM(ZMM2) |
|---|---|---|---|---|---|---|---|---|

| * | * | * | * | B | A | B | A | ZMM_VAL1=VCOMPRESS(K1, ZMM_VALUE) |
|---|---|---|---|---|---|---|---|---|

| 3 | 5 | 5 | 3 | 3 | 5 | 5 | 5 | ZMM_COUNT=VPOPCNT(ZMM1) |
|---|---|---|---|---|---|---|---|---|

| * | * | * | * | 3 | 5 | 3 | 5 | ZMM_CNT1=VCOMPRESS(K1, ZMM_COUNT) |
|---|---|---|---|---|---|---|---|---|

| 7 | 6 | 5 | 4 | 3 | 2 | 1 | 0 | OFFSET |
|---|---|---|---|---|---|---|---|---|
| B | A | A | B | B | A | A | A | ZMM_VALUE |

| 7 | 6 | 5 | 4 | 3 | 2 | 1 | 0 | |
|---|---|---|---|---|---|---|---|---|
| 0 | 1 | 1 | 0 | 0 | 1 | 1 | 1 | ZMM1=VCONFLICT_SQR(ZMM_VALUE) |
| 0 | 1 | 1 | 0 | 0 | 1 | 1 | 1 | |
| 0 | 1 | 1 | 0 | 0 | 1 | 1 | 1 | |
| 1 | 0 | 0 | 1 | 1 | 0 | 0 | 0 | |
| 1 | 0 | 0 | 1 | 1 | 0 | 0 | 0 | |
| 0 | 1 | 1 | 0 | 0 | 1 | 1 | 1 | |
| 0 | 1 | 1 | 0 | 0 | 1 | 1 | 1 | |
| 1 | 0 | 0 | 1 | 1 | 0 | 0 | 0 | |

| 7 | 6 | 5 | 4 | 3 | 2 | 1 | 0 | |
|---|---|---|---|---|---|---|---|---|
| 0 | 0 | 0 | 0 | 0 | 0 | 0 | 0 | ZMM_MASK_LEFT |
| 0 | 0 | 0 | 0 | 0 | 0 | 0 | 1 | |
| 0 | 0 | 0 | 0 | 0 | 0 | 1 | 0 | |
| 0 | 0 | 0 | 0 | 0 | 1 | 0 | 0 | |
| 0 | 0 | 0 | 0 | 1 | 0 | 0 | 0 | |
| 0 | 0 | 0 | 1 | 0 | 0 | 0 | 0 | |
| 0 | 0 | 1 | 0 | 0 | 0 | 0 | 0 | |
| 0 | 1 | 0 | 0 | 0 | 0 | 0 | 0 | |

| 7 | 6 | 5 | 4 | 3 | 2 | 1 | 0 | |
|---|---|---|---|---|---|---|---|---|
| 0 | 0 | 0 | 0 | 0 | 0 | 0 | 0 | ZMM2=VPAND(ZMM1, ZMM_MASK_LEFT) |
| 0 | 0 | 0 | 0 | 0 | 0 | 0 | 1 | |
| 0 | 0 | 0 | 0 | 0 | 0 | 1 | 0 | |
| 0 | 0 | 0 | 0 | 0 | 0 | 0 | 0 | |
| 0 | 0 | 0 | 0 | 1 | 0 | 0 | 0 | |
| 0 | 0 | 0 | 0 | 0 | 0 | 0 | 0 | |
| 0 | 0 | 1 | 0 | 0 | 0 | 0 | 0 | |
| 0 | 0 | 0 | 0 | 0 | 0 | 0 | 0 | |

| 7 | 6 | 5 | 4 | 3 | 2 | 1 | 0 | |
|---|---|---|---|---|---|---|---|---|
| 1 | 1 | 0 | 1 | 0 | 1 | 0 | 0 | K1=VPTESTNM(ZMM2) |

| 7 | 6 | 5 | 4 | 3 | 2 | 1 | 0 | |
|---|---|---|---|---|---|---|---|---|
| * | * | * | * | B | A | B | A | ZMM_VAL1=VCOMPRESS(K1, ZMM_VALUE) |

| 7 | 6 | 5 | 4 | 3 | 2 | 1 | 0 | |
|---|---|---|---|---|---|---|---|---|
| 1 | 1 | 1 | 1 | 1 | 1 | 1 | 1 | ZMM_ALL_1S |

| 7 | 6 | 5 | 4 | 3 | 2 | 1 | 0 | |
|---|---|---|---|---|---|---|---|---|
| 1 | 2 | 0 | 2 | 0 | 3 | 0 | 0 | ZMM_COUNT=VMASKREDUCTION_L(K1, ZMM_ALL_1S) |

| 7 | 6 | 5 | 4 | 3 | 2 | 1 | 0 | |
|---|---|---|---|---|---|---|---|---|
| * | * | * | * | 1 | 2 | 2 | 3 | ZMM_CNT1=VCOMPRESS(K1, ZMM_COUNT) |

Fig. 8

| OFFSET | 7 | 6 | 5 | 4 | 3 | 2 | 1 | 0 | |
|---|---|---|---|---|---|---|---|---|---|
| ZMM_VALUE | B | A | A | B | B | A | A | A | |

| | 7 | 6 | 5 | 4 | 3 | 2 | 1 | 0 | |
|---|---|---|---|---|---|---|---|---|---|
| | 0 | 1 | 1 | 0 | 0 | 1 | 1 | 1 | ZMM1=VCONFLICT_SQR(ZMM_VALUE) |
| | 0 | 1 | 1 | 0 | 0 | 1 | 1 | 1 | |
| | 0 | 1 | 1 | 0 | 0 | 1 | 1 | 1 | |
| | 1 | 0 | 0 | 1 | 1 | 0 | 0 | 0 | |
| | 1 | 0 | 0 | 1 | 1 | 0 | 0 | 0 | |
| | 0 | 1 | 1 | 0 | 0 | 1 | 1 | 1 | |
| | 0 | 1 | 1 | 0 | 0 | 1 | 1 | 1 | |
| | 1 | 0 | 0 | 1 | 1 | 0 | 0 | 0 | |

| | 7 | 6 | 5 | 4 | 3 | 2 | 1 | 0 | |
|---|---|---|---|---|---|---|---|---|---|
| | 0 | 0 | 0 | 0 | 0 | 0 | 0 | 0 | ZMM_MASK_LEFT |
| | 0 | 0 | 0 | 0 | 0 | 0 | 0 | 1 | |
| | 0 | 0 | 0 | 0 | 0 | 0 | 1 | 0 | |
| | 0 | 0 | 0 | 0 | 0 | 1 | 0 | 0 | |
| | 0 | 0 | 0 | 0 | 1 | 0 | 0 | 0 | |
| | 0 | 0 | 0 | 1 | 0 | 0 | 0 | 0 | |
| | 0 | 0 | 1 | 0 | 0 | 0 | 0 | 0 | |
| | 0 | 1 | 0 | 0 | 0 | 0 | 0 | 0 | |

| | 7 | 6 | 5 | 4 | 3 | 2 | 1 | 0 | |
|---|---|---|---|---|---|---|---|---|---|
| | 0 | 0 | 0 | 0 | 0 | 0 | 0 | 0 | ZMM2=VPAND(ZMM1, ZMM_MASK_LEFT) |
| | 0 | 0 | 0 | 0 | 0 | 0 | 0 | 1 | |
| | 0 | 0 | 0 | 0 | 0 | 0 | 1 | 0 | |
| | 0 | 0 | 0 | 0 | 0 | 0 | 0 | 0 | |
| | 0 | 0 | 0 | 0 | 1 | 0 | 0 | 0 | |
| | 0 | 0 | 0 | 0 | 0 | 0 | 0 | 0 | |
| | 0 | 0 | 1 | 0 | 0 | 0 | 0 | 0 | |
| | 0 | 0 | 0 | 0 | 0 | 0 | 0 | 0 | |

| 1 | 1 | 0 | 1 | 0 | 1 | 0 | 0 | K1=VPTESTNM(ZMM2) |
|---|---|---|---|---|---|---|---|---|

| * | * | * | * | B | A | B | A | ZMM_VAL1=VCOMPRESS(K1, ZMM_VALUE) |
|---|---|---|---|---|---|---|---|---|

| 1 | 1 | 1 | 1 | 1 | 1 | 1 | 1 | ZMM_ALL_1S |
|---|---|---|---|---|---|---|---|---|

| * | * | * | * | 1 | 2 | 2 | 3 | ZMM_CNT1=VMASKREDUCTIONCOMP_L (K1, ZMM_ALL_1S) |
|---|---|---|---|---|---|---|---|---|

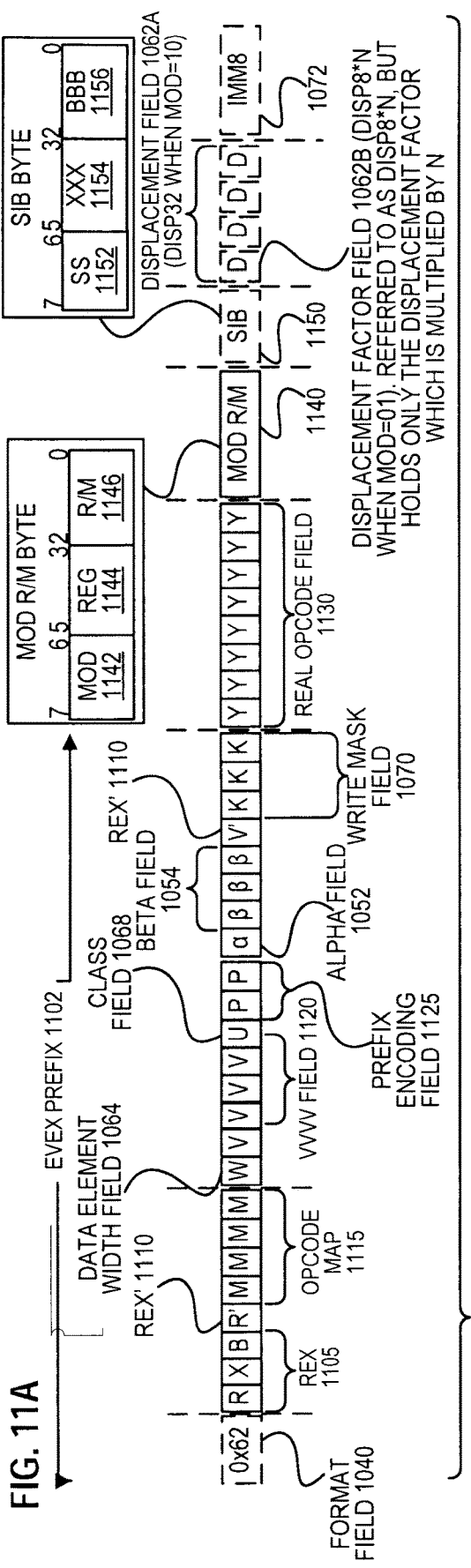
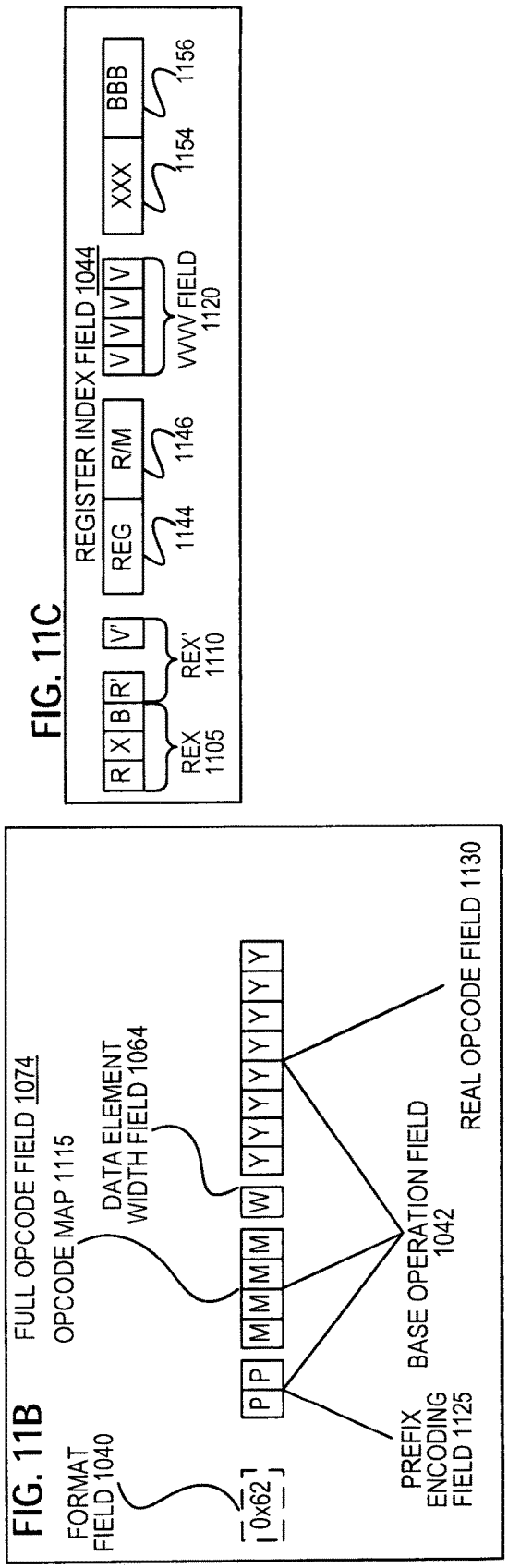

FIG. 12
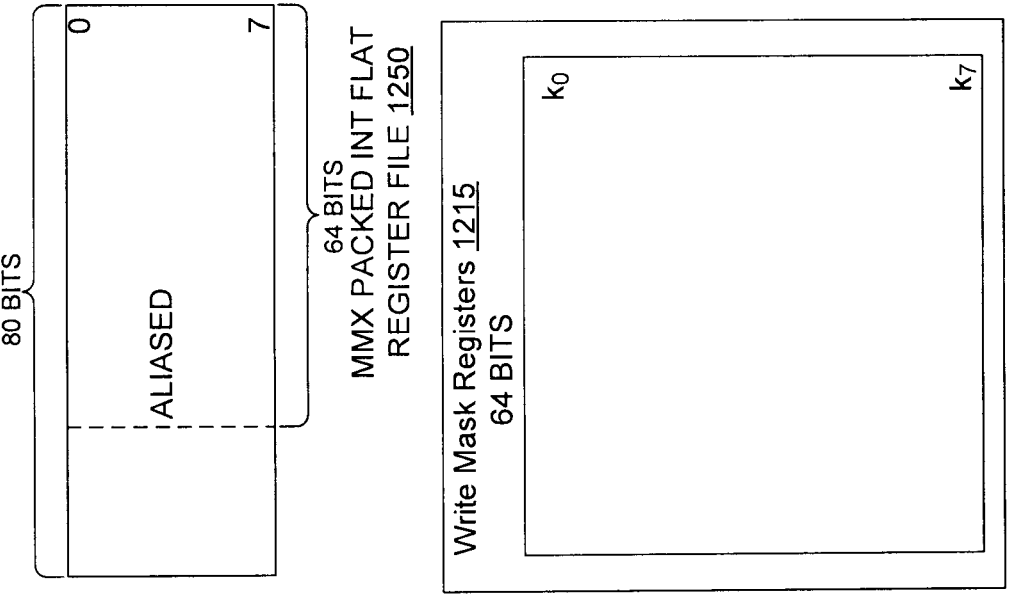
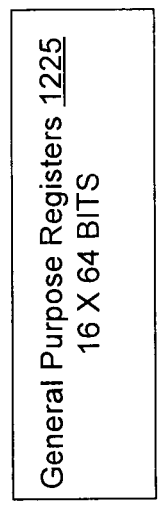
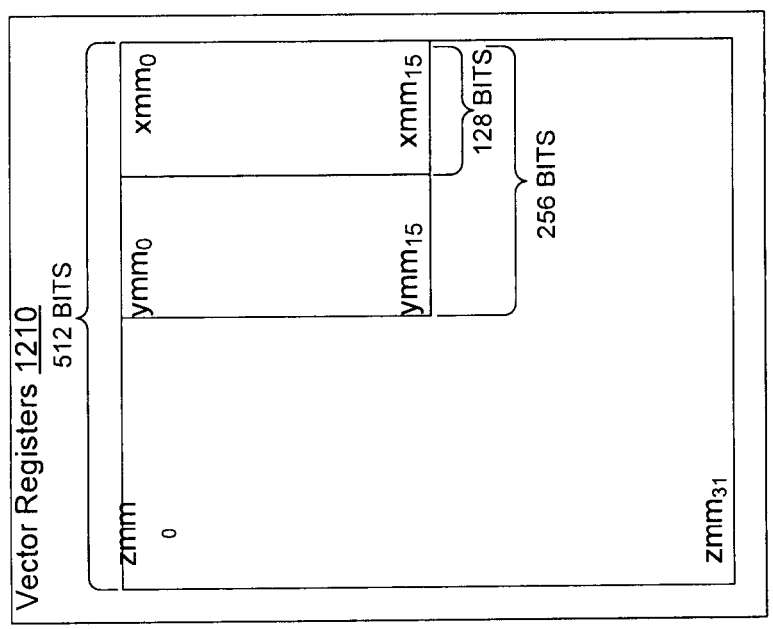

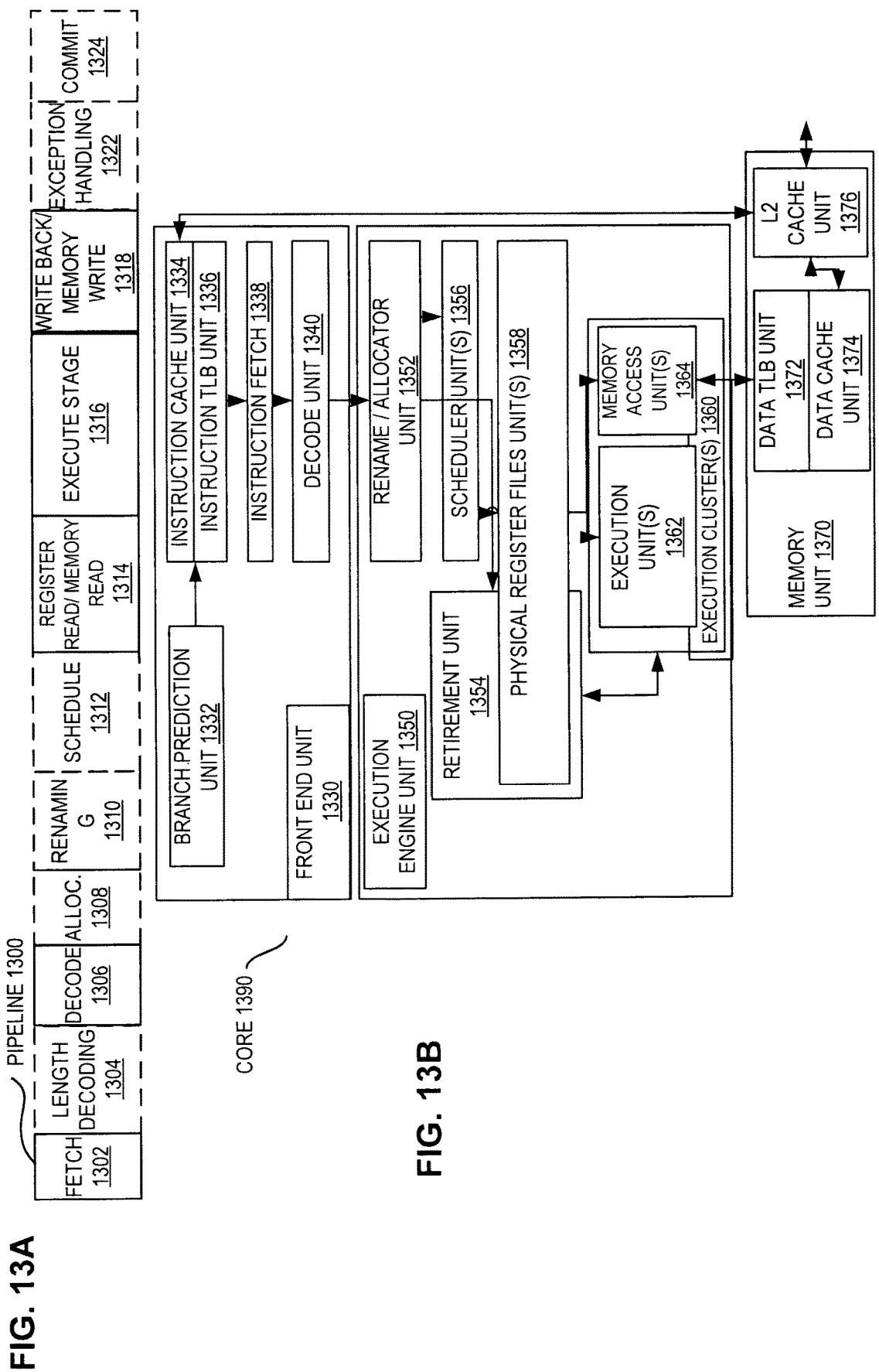

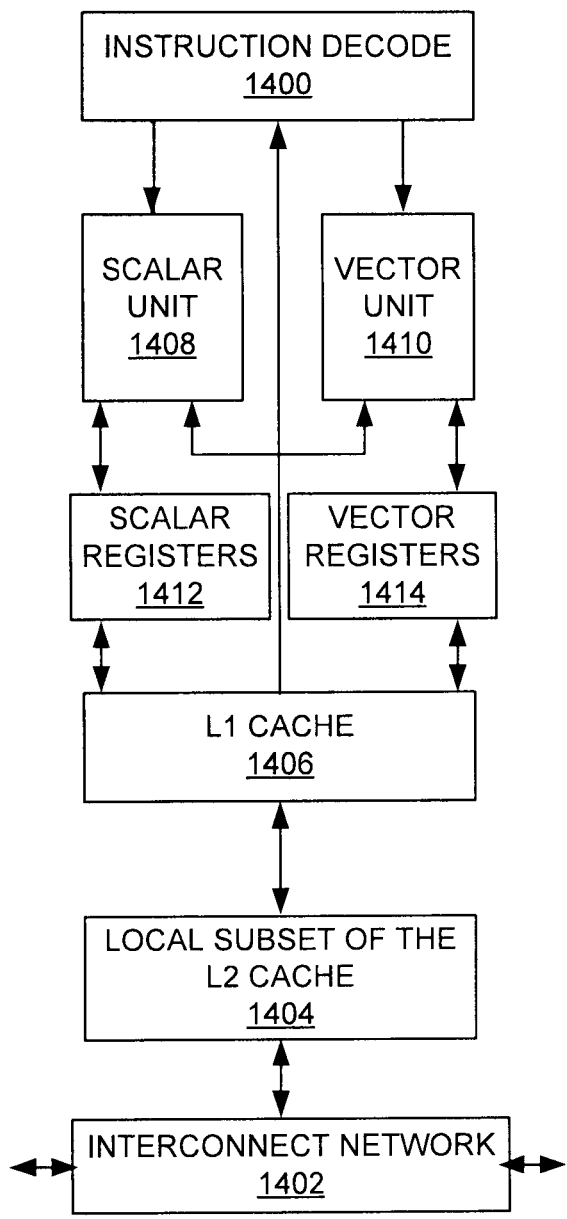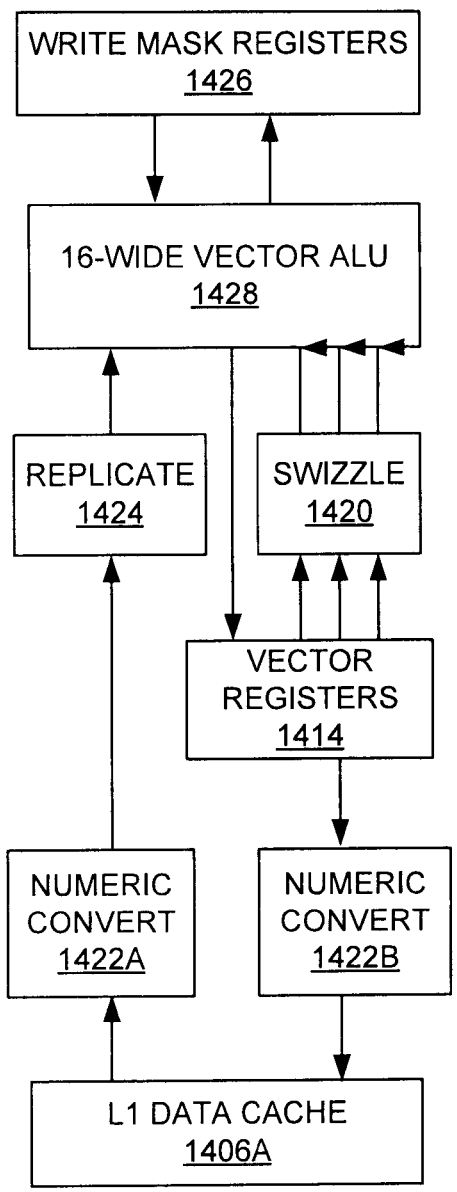

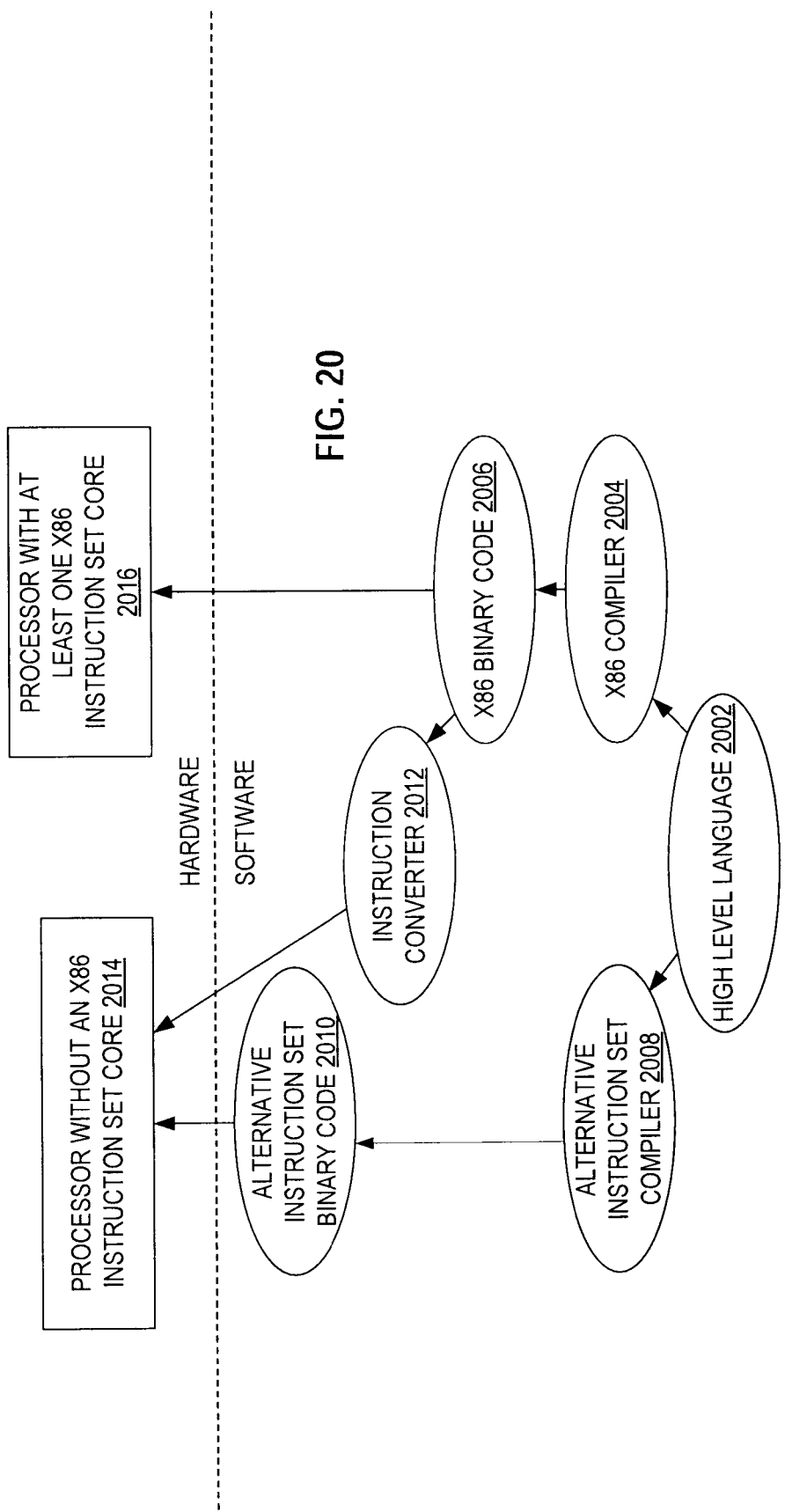

VECTOR INSTRUCTION FOR ACCUMULATING AND COMPRESSING VALUES BASED ON INPUT MASK

TECHNICAL FIELD

Embodiments of the invention relate to the field of computer instruction set architecture; and more specifically, to vector instructions for accumulating and compressing values based on an input mask.

BACKGROUND

A processor, or set of processors, executes instructions from an instruction set, e.g., the instruction set architecture (ISA). The instruction set is the part of the computer architecture related to programming, and generally includes the native data types, instructions, register architecture, addressing modes, memory architecture, interrupt and exception handling, and external input and output (I/O). It should be noted that the term instruction as used herein generally refers to a macro-instruction (e.g., an instruction that is provided to the processor for execution), as opposed to a micro-instruction (e.g., an instruction that results from a processor's decoder decoding macro-instructions).

Modern processors often include instructions to provide operations that are computationally intensive, but offer a high level of data parallelism that can be exploited through an efficient implementation using various data storage devices, such as for example, single-instruction multiple-data (SIMD) vector registers. In SIMD execution, a single instruction operates on multiple data elements concurrently or simultaneously. This is typically implemented by extending the width of various resources such as registers and arithmetic logic units (ALUs), allowing them to hold and operate on multiple data elements, respectively.

Run-length encoding is a simple form of lossless data compression in which "runs" of data (e.g., sequences in which the same data value occurs in multiple consecutive data elements) are stored as a single data value and a corresponding count. For example, run-length encoding may compress the sequence "AAAAABBBCCDDDDDDD-DEEEE" to "A5B3C2D7E4". This can also be encoded as a sequence of values and a sequence of corresponding counts (e.g., "ABCDE" and "53274"). Run-length encoding can be vectorized with SIMD execution. However, conventional techniques for performing vectorized run-length encoding may only produce the correct result for certain sequences and/or may be inefficient.

BRIEF DESCRIPTION OF THE DRAWINGS

FIG. 2 is a diagram illustrating a sequence of instructions being executed to perform vectorized run-length encoding using a left-border compression mask, according to conventional techniques;

FIG. 3 is a diagram illustrating a sequence of instructions being executed to perform vectorized run-length encoding using a right-border compression mask, according to conventional techniques;

FIG. 4 is a diagram illustrating a sequence of instructions being executed to perform vectorized run-length encoding that produces an incorrect result due to the input vector containing duplicated runs, according to conventional techniques;

FIG. 6 is a diagram illustrating a sequence of instructions being executed to perform vectorized run-length encoding for a vector containing duplicated runs using a left-border compression mask, according to some embodiments;

FIG. 8 is a diagram illustrating a sequence of instructions being executed to perform vectorized run-length encoding for a vector containing duplicated runs using a left-border compression mask, according to some embodiments;

FIG. 10A is a block diagram illustrating a generic vector friendly instruction format and class A instruction templates thereof according to embodiments of the invention;

FIG. 10B is a block diagram illustrating the generic vector friendly instruction format and class B instruction templates thereof according to embodiments of the invention;

FIG. 11A is a block diagram illustrating an exemplary specific vector friendly instruction format according to embodiments of the invention;

FIG. 11B is a block diagram illustrating the fields of the specific vector friendly instruction format 1100 that make up the full opcode field 1074 according to one embodiment of the invention;

FIG. 11C is a block diagram illustrating the fields of the specific vector friendly instruction format 1100 that make up the register index field 1044 according to one embodiment of the invention;

FIG. 12 is a block diagram of a register architecture 1200 according to one embodiment of the invention;

FIG. 13A is a block diagram illustrating both an exemplary in-order pipeline and an exemplary register renaming, out-of-order issue/execution pipeline according to embodiments of the invention;

FIG. 13B is a block diagram illustrating both an exemplary embodiment of an in-order architecture core and an exemplary register renaming, out-of-order issue/execution architecture core to be included in a processor according to embodiments of the invention;

FIGS. 14A-B illustrate a block diagram of a more specific exemplary in-order core architecture, which core would be one of several logic blocks (including other cores of the same type and/or different types) in a chip;

FIG. 14A is a block diagram of a single processor core, along with its connection to the on-die interconnect network 1402 and with its local subset of the Level 2 (L2) cache 1404, according to embodiments of the invention;

FIG. 14B is an expanded view of part of the processor core in FIG. 14A according to embodiments of the invention;

FIG. 16 shown a block diagram of a system in accordance with one embodiment of the present invention;

FIG. 17 is a block diagram of a first more specific exemplary system in accordance with an embodiment of the present invention;

FIG. 18 is a block diagram of a second more specific exemplary system in accordance with an embodiment of the present invention;

FIG. 19 is a block diagram of a SoC in accordance with an embodiment of the present invention; and FIG. 20 is a block diagram contrasting the use of a software instruction converter to convert binary instructions in a source instruction set to binary instructions in a target instruction set according to embodiments of the invention.

DETAILED DESCRIPTION

In the following description, numerous specific details are set forth. However, it is understood that embodiments of the disclosure may be practiced without these specific details. In other instances, well-known circuits, structures and techniques have not been shown in detail to not obscure the understanding of this description.

References in the specification to "one embodiment," "an embodiment," "an example embodiment," etc., indicate that the embodiment described may include a particular feature, structure, or characteristic, but every embodiment need not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
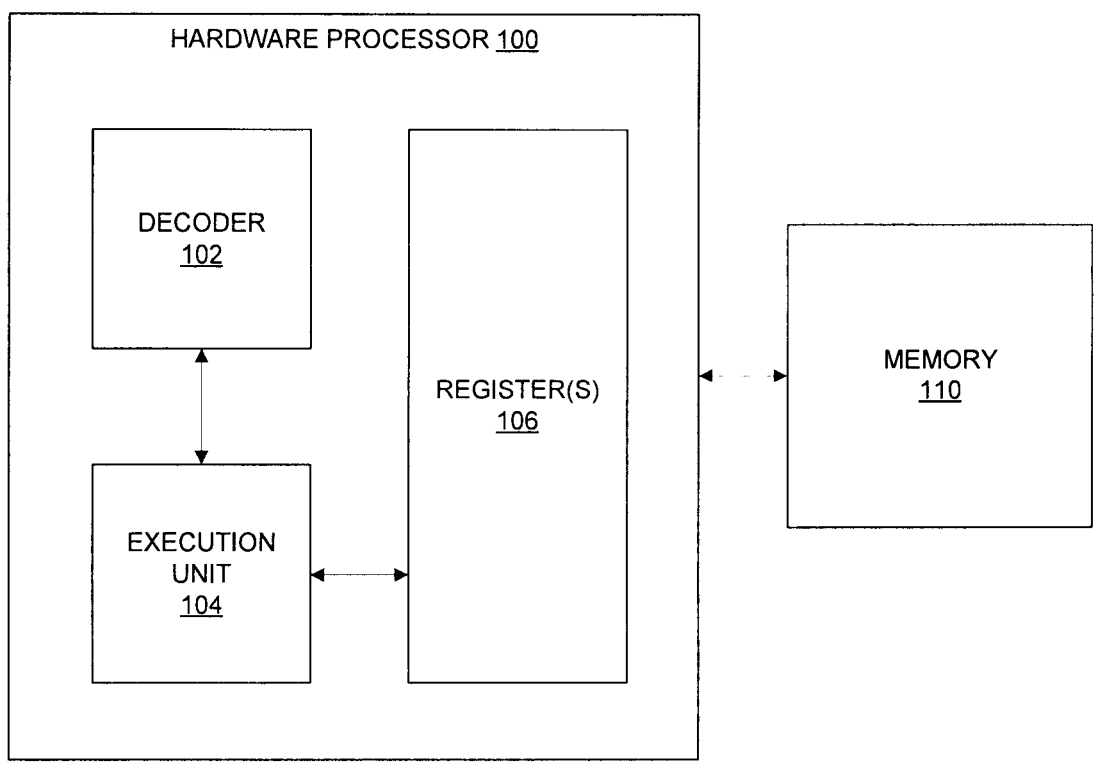
FIG. 1 is a block diagram illustrating a hardware processor and a memory for executing instructions, according to some embodiments.

FIG. 1 is a block diagram illustrating a hardware processor and a memory for executing instructions, according to some embodiments. Depicted hardware processor 100 includes a hardware decoder 102 (e.g., decode unit or decode circuit) and a hardware execution unit 104 (e.g., execution circuit). Depicted hardware processor 100 includes register(s) 106. Registers 106 may include one or more registers to perform operations in, e.g., additionally or alternatively to access of (e.g., load or store) data in memory 110. Note that the figures herein may not depict all data communication connections. One of ordinary skill in the art will appreciate that this is to not obscure certain details in the figures. Note that a double headed arrow in the figures may not require two-way communication. For example, it may indicate one-way communication (e.g., to or from that component or device). Any or all combinations of communications paths may be utilized in certain embodiments herein.

Hardware decoder 102 may receive an instruction (e.g., macro-instruction) and decode the instruction (e.g., into micro-instructions and/or micro-operations). Execution unit 104 may execute the decoded instruction to perform one or more operations. The decoder 102 and the execution unit 104 may decode and execute any of the instructions disclosed herein (e.g., instructions disclosed with reference to FIGS. 1-9). Certain embodiments disclosed herein introduce a vector accumulation instruction that can be decoded and executed by the decoder 102 and execution unit 104, respectively. Certain embodiments disclosed herein introduce a vector accumulation and compression instruction that can be decoded and executed by the decoder 102 and execution unit 104, respectively. As will be described in additional detail below, these instructions may be utilized to perform vectorized run-length encoding for vectors.

Run-length encoding is a simple form of lossless data compression in which "runs" of data (e.g., sequences in which the same data value occurs in multiple consecutive data elements) are stored as a single data value and a corresponding count. For example, run-length encoding may compress the sequence "AAAAABBBCCDDDDDD-DEEEE" to "A5B3C2D7E4". This can also be encoded as a sequence of values and a sequence of corresponding counts (e.g., "ABCDE" and "53274").

According to conventional techniques, the following sequence of instructions may be executed to perform vectorized run-length encoding for an input vector ZMM_VALUE:

(1) ZMM1=VCONFLICT_SQR(ZMM_VALUE);
(2) ZMM2=VPAND(ZMM1, ZMM_MASK);
(3) K1=VPTESTNM(ZMM2);
(4) ZMM_VAL=VCOMPRESS(K1, ZMM_VALUE);
(5) ZMM_COUNT=VPOPCNT(ZMM1);
(6) ZMM_CNT1=VCOMPRESS(K1, ZMM_COUNT);

In the above sequence of instructions, ZMM_VALUE is the vector containing the sequence of values that is to be compressed (the input vector) and ZMM_MASK is a predefined (constant) mask that masks out bits from the output of the VCONFLICT_SQR instruction. In the above sequence of instructions, (1) is an instruction to perform a square conflict operation (e.g., take an element of an input vector and compare it to all other elements of the input vector; and repeat the same for all elements of the input vector). In the above sequence of instructions, (2) is an instruction to perform a bitwise logical AND operation. In the above sequence of instructions, (3) is an instruction to perform a vector packed test for zero (e.g., if element is zero, then mask bit corresponding to element is set to 1; if element is non-zero, then mask bit corresponding to element is set to 0). In the above sequence of instructions, (4) is an instruction to perform vector compression. In the above sequence of instructions, (5) is an instruction to perform vector population count (e.g., count number of bits set to binary '1'). In the above sequence of instructions, (6) is an instruction to perform vector compression.

FIG. 2 is a diagram illustrating a sequence of instructions being executed to perform vectorized run-length encoding using a left-border compression mask, according to conventional techniques. In the figures, each vertical column represents bit positions of the same lane of a vector register. The "offset" refers to the position of an element. In this example and other examples provided herein, there are eight (KL=8) elements in a vector. The values and sizes of the input vector and other vectors are provided by way of example for purposes of illustration. It should be understood that other values and sizes may be utilized. ZMM_VALUE is the vector containing the sequence of values that is to be compressed (the input vector). In this example, ZMM_VALUE contains the sequence of values "AAABBCCD" (from least significant bit (LSB) to most significant bit (MSB)). Executing the VCONFLICT_SQR (ZMM_VALUE) instruction produces ZMM1. ZMM_MASK_LEFT is a predefined left-border compression mask. Executing the VPAND(ZMM1, ZMM_

MASK_LEFT) instruction produces ZMM2. Executing the VPTESTNM(ZMM2) instruction produces K1. Executing the VCOMPRESS(K1, ZMM_VALUE) instruction produces ZMM_VAL1. Executing the VPOPCNT(ZMM1) instruction produces ZMM_COUNT. Executing the VCOMPRESS(K1, ZMM_COUNT) instruction produces ZMM_CNT1. As a result, ZMM_VAL1 contains the sequence of values "ABCD" and ZMM_CNT1 contains the sequence of corresponding counts "3221", which is the compressed form of the original sequence of values "AAABBCCD" contained in ZMM_VALUE.

FIG. 3 is a diagram illustrating a sequence of instructions being executed to perform vectorized run-length encoding using a right-border compression mask, according to conventional techniques. As shown in FIG. 3, the same sequence of instructions mentioned above with reference to FIG. 2 can be executed with a right-border compression mask (e.g., ZMM_MASK_RIGHT) instead of a left-border compression mask (e.g., ZMM_MASK_LEFT) to produce the same result.

The conventional techniques described above produce the correct result when all of the runs contained in the input vector (e.g., ZMM_VALUE) have unique values. However, if there are any duplicated runs contained in the input vector (e.g., the input vector contains at least two runs that have the same value), then the VCONFLICT_SQR instruction produces additional binary '1's that appear outside of the diagonal blocks, which causes the VPOPCNT instruction to produce an incorrect sequence of counts in ZMM_COUNT (although, it should be noted that the conventional techniques still produce the correct sequence of values in ZMM_VAL1).

FIG. 4 is a diagram illustrating a sequence of instructions being executed to perform vectorized run-length encoding that produces an incorrect result due to the input vector containing duplicated runs, according to conventional techniques. In this example, ZMM_VALUE (the input vector) contains the sequence of values "AAABBAAB" (from LSB to most MSB). ZMM_VALUE thus contains duplicated runs. For example, ZMM_VALUE contains two runs having value "A" (run "AAA" and run "AA") and two runs having value "B" (run "BB" and run "B"). As a result, the VCONFLICT_SQR instruction produces additional binary '1's that appear outside of the diagonal blocks, which causes the VPOPCNT instruction to produce an incorrect sequence of counts in ZMM_COUNT. In this example, ZMM_VAL1 contains the correct sequence of values ("ABAB"). However, ZMM_COUNT contains an incorrect sequence of counts ("5353") (the correct sequence of counts is "3221").

As can be seen from the example described above, conventional techniques for performing vectorized run-length encoding are not applicable for arbitrary input vectors. The conventional techniques are only applicable when all of the runs contained in the input vector have unique values. If the input vector contains any duplicated runs, then the input vector needs to be processed in a scalar manner or split into blocks that do not contain duplicated runs, after which conventional techniques can be applied. This requires additional overhead to perform dynamic checks and/or serialization, which degrades performance. Certain embodiments disclosed herein overcome the disadvantages of the conventional techniques by providing a vector accumulation instruction that can be utilized to perform run-length encoding for arbitrary input vectors (and not just for input vectors where all of the runs have unique values).

In one embodiment, a vector accumulation instruction has the following definition:

```
VMASKREDUCTION_R{B, W, D, Q} dest{k1}, src
(KL, VL) = (64, 512), (32, 512), (16, 512), (8, 512) // where KL is the
number of elements in the source/destination vector and VL is the vector
length
tmp = 0 // temporary scalar accumulator
for (i = KL - 1; i >= 0; i--) {
    tmp += src[i]
    if (k1[i]) {
        dest[i] = tmp
        tmp = 0
    }
}
```

In this instruction, {B, W, D, Q} indicates the size of supported elements (e.g., byte (B), word (W), doubleword (D), and quadword (Q)). In this instruction, {k1} indicates the input mask. In one embodiment, operation of this instruction may be described as follows: in a loop going through all KL elements of a source operand, cumulatively add the value of each element and store it in a temporary scalar accumulator (e.g., tmp) until the corresponding bit of the input mask has a non-zero value (e.g., binary '1'). If the corresponding bit of the input mask has a non-zero value (e.g., binary '1'), then store the value of the temporary scalar accumulator in the corresponding element of the destination operand and reset the value of the temporary scalar accumulator. With this instruction, the elements of the source operand are processed from left to right (e.g., MSB to LSB) and the value of the temporary scalar accumulator is stored in the destination operand when a non-zero value is encountered in the corresponding bit of the input mask. The input mask effectively dictates how to divide the source operand (e.g., an input vector) into blocks of contiguous elements. When the elements of the source operand are processed from left to right, the input mask indicates the right border of each block. The values contained in each block are summed to produce an accumulated value for that block, which is stored in the destination operand.

In one embodiment, a vector accumulation instruction has the following definition:

```
VMASKREDUCTION_L{B, W, D, Q} dest{k1}, src
(KL, VL) = (64, 512), (32, 512), (16, 512), (8, 512) // where KL is the
number of elements in the source/destination vector and VL is the vector
length
tmp = 0 // temporary scalar accumulator
for (i = 0; i < KL; i++) {
    tmp += src[i]
    if (k1[i]) {
        dest[i] = tmp
        tmp = 0
    }
}
```

In this instruction, {B, W, D, Q} indicates the size of supported elements (e.g., byte (B), word (W), doubleword (D), and quadword (Q)). In this instruction, {k1} indicates the input mask. In one embodiment, the operation of this instruction may be described as follows: in a loop going through all KL elements of a source operand, cumulatively add the value of each element and store it in a temporary scalar accumulator (e.g., tmp) until the corresponding bit of the input mask has a non-zero value (e.g., binary '1'). If the corresponding bit of the input mask has a non-zero value (e.g., binary '1'), then store the value of the temporary scalar accumulator in the corresponding element of the destination operand and reset the value of the temporary scalar accumulator. With this instruction, the elements of the source operand are processed from right to left (e.g., LSB to MSB) and the value of the temporary scalar accumulator is stored in the destination operand when a non-zero value is encountered in the corresponding bit of the input mask. The input mask effectively dictates how to divide the source operand (e.g., an input vector) into blocks of contiguous elements. When the elements of the source operand are processed from right to left, the input mask indicates the left border of each block. The values contained in each block are summed to produce an accumulated value for that block, which is stored in the destination operand.

Figure 5:
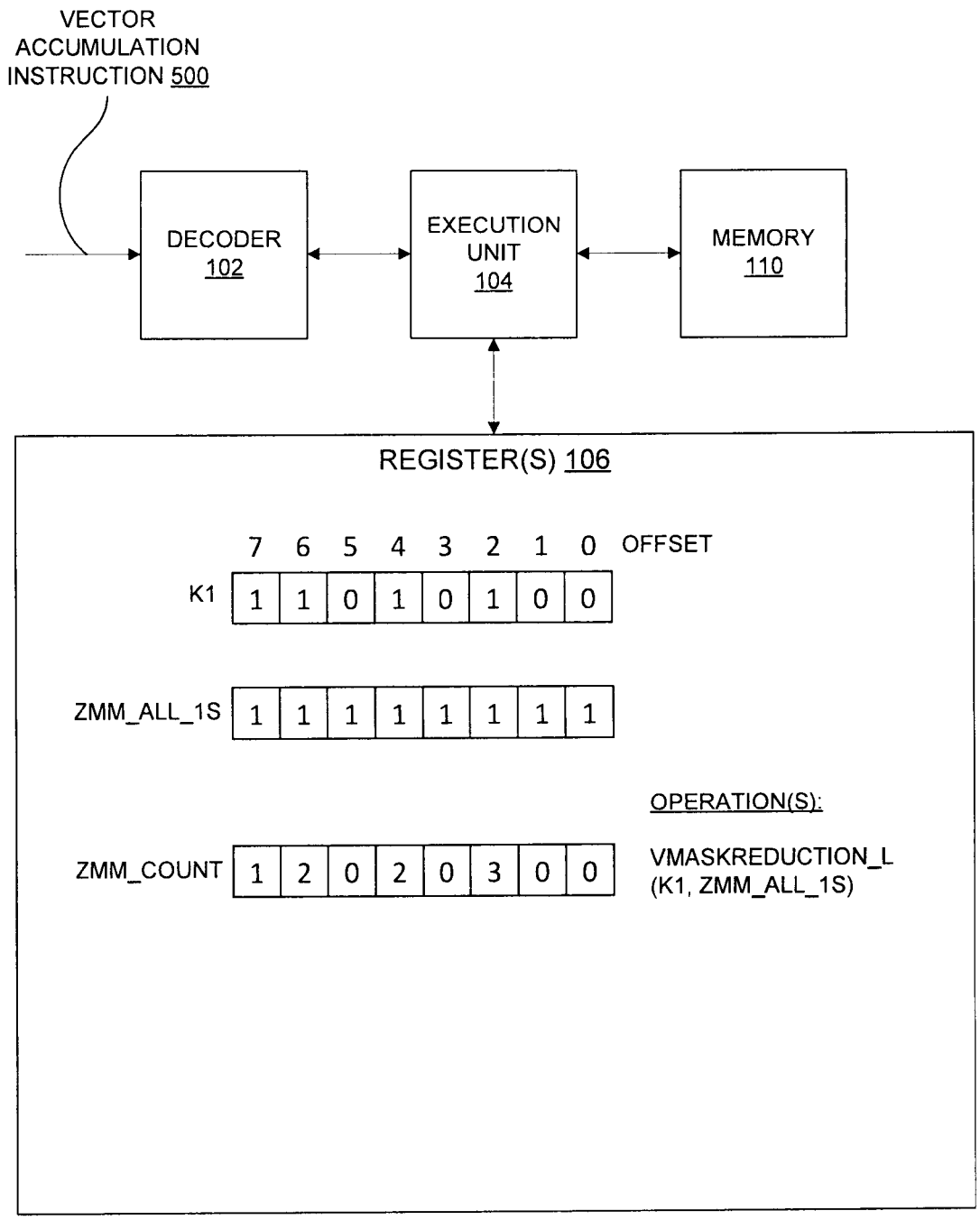
FIG. 5 is a diagram illustrating a hardware processor that decodes and executes a vector accumulation instruction, according to some embodiments.

FIG. 5 is a diagram illustrating a hardware processor that decodes and executes a vector accumulation instruction, according to some embodiments. Vector accumulation instruction 500 may be decoded by the decoder 102 and executed by the execution unit 104. Data may be accessed in register(s) 106 and/or memory 110. The vector accumulation instruction 500 may take an input mask (e.g., K1) and an input vector (e.g., ZMM ALL_1S) as operands. In this example, the input mask indicates the left border of each block. According to the input mask, the elements at positions 2, 4, 6, and 7, are the left borders of the respective blocks. As such, elements at positions 0-2 are grouped as a block, with the element at position 2 being the left border of the block. Elements at positions 3 and 4 are grouped as a block, with the element at position 4 being the left border of the block. Elements at positions 5 and 6 are grouped as a block, with the element at position 6 being the left border of the block. The element at position 7 is a block (with a single element), with this element also being the left border of the block. In this example, the input vector contains all binary '1's. In one embodiment, the execution unit 104 executes the vector accumulation instruction 500 (e.g., VMASKREDUCTION_L) to cause the elements of the destination vector (e.g., ZMM_COUNT) corresponding to the left border of each block (as indicated by the input mask) to be populated with an accumulated value for that block. The accumulated value for a block is a sum of the values of the elements within the block. In this example, the element at position 2 of the destination vector has a value of '3', the element at position 4 of the destination vector has a value of '2', the element at position 6 of the destination vector has a value of '2', and the element at position 7 of the destination vector has a value of '1'. Other elements of the destination vector (positions 0, 1, 3, and 5) may be undefined. In one embodiment, they may be set to zero or remain unchanged depending on the masking mode of the instruction. In the diagram, they are shown as being set to zero.

The following sequence of instruction may be executed to perform vectorized run-length encoding for an input vector ZMM_VALUE:

(1) ZMM1=VCONFLICT SQR(ZMM_VALUE);
(2) ZMM2=VPAND(ZMM1, ZMM_MASK);
(3) K1=VPTESTNM(ZMM2);
(4) ZMM_VAL1=VCOMPRESS(K1, ZMM_VALUE);
(5) ZMM_COUNT=VMASKREDUCTION L(K1, ZMM_ALL_1S);
(6) ZMM_CNT1=VCOMPRESS(K1, ZMM_COUNT);

In the above sequence of instructions, ZMM_VALUE is the vector containing the sequence of values that is to be compressed (the input vector). In the above sequence of instructions, ZMM_MASK is a predefined (constant) mask that masks out bits from the output of the VCONFLICT_SQR instruction. In the above sequence of instructions, ZMM_ALL_1S is a predefined vector containing all binary '1's. In the above sequence of instructions, (1) is an instruction to perform a square conflict operation (e.g., take an element of an input vector and compare it to all other elements of the input vector; and repeat the same for all elements of the input vector). In the above sequence of instructions, (2) is an instruction to perform a bitwise logical AND operation. In the above sequence of instructions, (3) is an instruction to perform a vector packed test for zero. In the above sequence of instructions, (4) is an instruction to perform vector compression. In the above sequence of instructions, (5) is an instruction to perform vector accumulation. In the above sequence of instructions, (6) is an instruction to perform vector compression.

FIG. 6 is a diagram illustrating a sequence of instructions being executed to perform vectorized run-length encoding for a vector containing duplicated runs using a left-border compression mask, according to some embodiments. In this example, ZMM_VALUE (the input vector) contains the sequence of values "AAABBAAB" (from LSB to MSB). It is to be noted that the conventional techniques for performing vectorized run-length encoding described above produced an incorrect result for this particular sequence of values (as illustrated in FIG. 4). The sequence of instructions described herein below, which utilizes a vector accumulation instruction (e.g., VMASKREDUCTION_L), however, produces the correct result for arbitrary input vectors (even when the input vector contains duplicated runs).

Executing the VCONFLICT_SQR(ZMM_VALUE) instruction produces ZMM1. ZMM_MASK_LEFT is a predefined left-border compression mask. Executing the VPAND(ZMM1, ZMM_MASK_LEFT) instruction produces ZMM2. Executing the VPTESTNM(ZMM2) instruction produces K1. Executing the VCOMPRESS(K1, ZMM_VALUE) instruction produces ZMM_VAL1. Executing the VMASKREDUCTION_L(K1, ZMM_ALL_1S) instruction produces ZMM_COUNT. Executing the VCOMPRESS(K1, ZMM_COUNT) instruction produces ZMM_CNT1. As a result, ZMM_VAL1 contains the sequence of values "ABAB" and ZMM_CNT1 contains the sequence of corresponding counts "3221", which is the compressed form of the original sequence of values "AAABBAAB" contained in ZMM_VALUE. It should be noted that vectorized run-length encoding can be performed using a right-border compression mask (e.g., ZMM MASK RIGHT) instead of a left-border compression mask to produce the same result. In this case, the VMASKREDUCTION_R instruction is executed in place of the VMASKREDUCTION_L instruction.

In one embodiment, the vector accumulation and compression can be performed by a single instruction, referred to herein as a vector accumulation and compression instruction. In one embodiment, a vector accumulation and compression instruction has the following definition:

```
VMASKREDUCTIONCOMP_L{B, W, D, Q} dest{k1}, src
(KL, VL) = (64, 512), (32, 512), (16, 512), (8, 512) // where KL is the
number of elements in the source/destination vector and VL is the vector
length
tmp = 0 // temporary scalar accumulator
n = 0 // starting position in destination
for (i = 0; i < KL; i++) {
    tmp += src[i]
    if (k1[i]) {
        dest[n] = tmp
        n++
        tmp = 0
    }
}
```

In this instruction, {B, W, D, Q} indicates the size of supported elements (e.g., byte (B), word (W), doubleword (D), and quadword (Q). In this instruction, {k1} indicates the input mask. In one embodiment, operation of this instruction may be described as follows: in a loop going through all KL elements of a source operand, cumulatively add the value of each element and store it in a temporary scalar accumulator (e.g., tmp) until the corresponding bit of the input mask has a non-zero value (e.g., binary '1'). If the corresponding bit of the input mask has a non-zero value (e.g., binary '1'), then store the value of the temporary scalar accumulator in the element at the current position (e.g., n) in the destination operand, update the current position (e.g., increment n), and reset the value of the temporary scalar accumulator. With this instruction, the elements of the source operand are processed from right to left (e.g., LSB to MSB) and the value of the temporary scalar accumulator is stored in the destination operand in a compressed manner when a non-zero value is encountered in the corresponding bit of the input mask.

In one embodiment, a vector accumulation and compression instruction has the following definition:

```
VMASKREDUCTIONCOMP_R{B, W, D, Q} dest{k1}, src
(KL, VL) = (64, 512), (32, 512), (16, 512), (8, 512) // where KL is the
number of elements in the source/destination vector and VL is the vector
length
tmp = 0 // temporary scalar accumulator
n = popcnt(k1) // starting position in destination
for (i = KL - 1; i >= 0; i--) {
    tmp += src[i]
    if (k1[i]) {
        dest[n] = tmp
        n--
        tmp = 0
    }
}
```

In this instruction, {B, W, D, Q} indicates the size of supported elements (e.g., byte (B), word (W), doubleword (D), and quadword (Q). In this instruction, {k1} indicates the input mask. In one embodiment, operation of this instruction may be described as follows: set the current position in the destination operand (e.g., n) to the number of binary '1's in the input mask (e.g., using popcnt instruction). In a loop going through all KL elements of a source operand, cumulatively add the value of each element and store it in a temporary scalar accumulator (e.g., tmp) until the corresponding bit of the input mask has a non-zero value (e.g., binary '1'). If the corresponding bit of the input mask has a non-zero value (e.g., binary '1'), then store the value of the temporary scalar accumulator in the element at the current position (e.g., n) in the destination operand, update the current position (e.g., decrement n), and reset the value of the temporary scalar accumulator. With this instruction, the elements of the source operand are processed from left to right (e.g., MSB to LSB) and the value of the temporary scalar accumulator is stored in the destination operand in a compressed manner when a non-zero value is encountered in the corresponding bit of the input mask.

Figure 7:
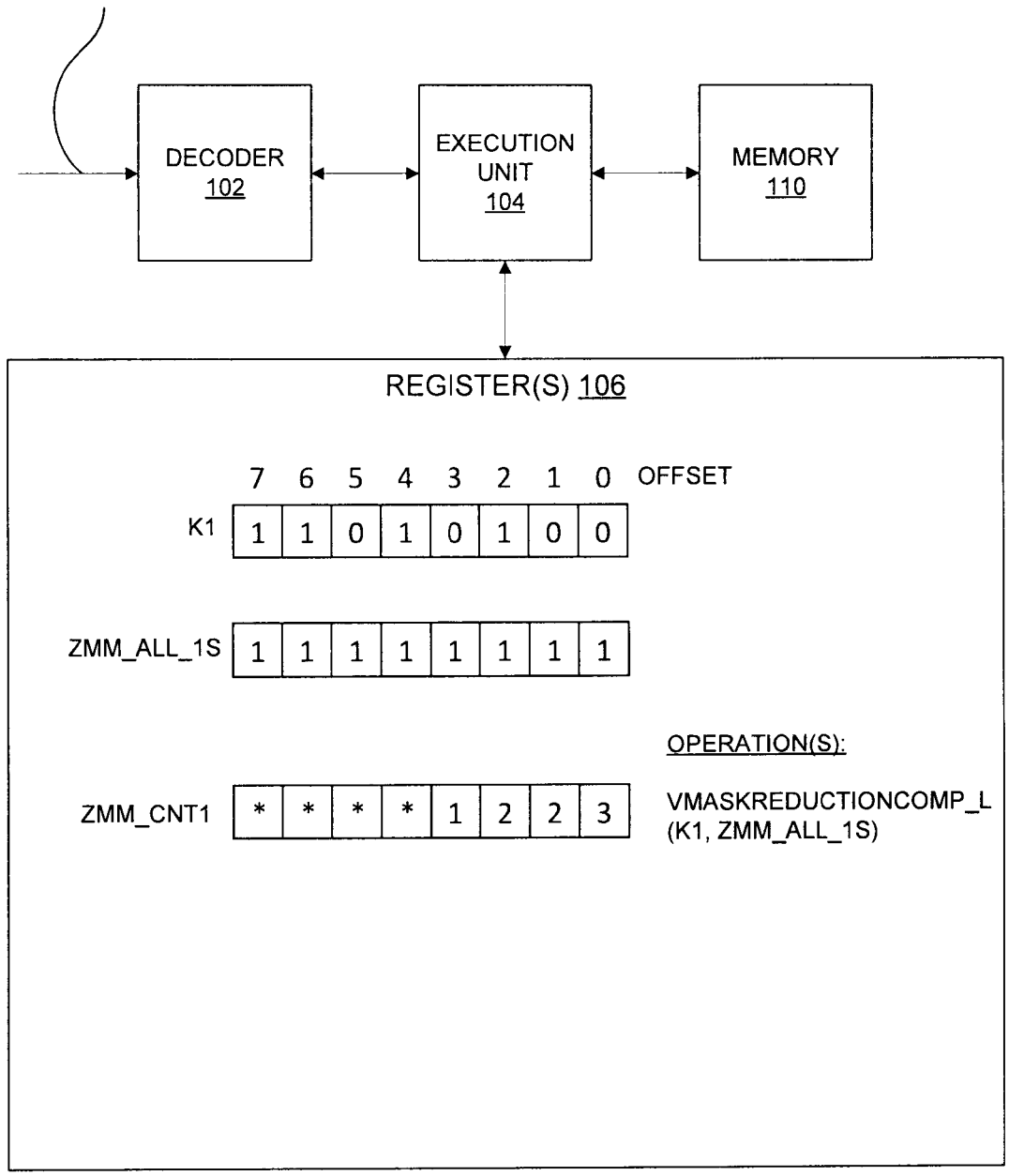
FIG. 7 is a diagram illustrating a hardware processor that decodes and executes a vector accumulation and compression instruction, according to some embodiments.

FIG. 7 is a diagram illustrating a hardware processor that decodes and executes a vector accumulation and compression instruction, according to some embodiments. Vector accumulation and compression instruction 700 may be decoded by the decoder 102 and executed by the execution unit 104. Data may be accessed in register(s) 106 and/or memory 110. The vector accumulation and compression instruction 700 may take an input mask (e.g., K1) and an input vector (e.g., ZMM_ALL_1S) as operands. In this example, the input mask indicates the left border of each block. According to the input mask, the elements at positions 2, 4, 6, and 7, are the left borders of the respective blocks. As such, elements at positions 0-2 are grouped as a block, with the element at position 2 being the left border of the block. Elements at positions 3 and 4 are grouped as a block, with the element at position 4 being the left border of the block. Elements at positions 5 and 6 are grouped as a block, with the element at position 5 being the left border of the block. The element at position 7 is a block (with a single element), with this element also being the left border of the block. In this example, the input vector contains all binary '1's. In one embodiment, the execution unit 104 executes the vector accumulation and compression instruction (e.g., VMASKREDUCTIONCOMP_L) to cause the elements of the destination vector (e.g., ZMM_CNT1) to be populated with the accumulated values of the respective blocks in a compressed manner. The accumulated value for a block is a sum of the values of the elements within the block. In this example, the element at position 0 of the destination vector has a value of '3', the element at position I of the destination vector has a value of '2', the element at position 2 of the destination vector has a value of '2', and the element at position 3 of the destination vector has a value of '1'. The upper elements of the destination vector (positions 4-7) are undefined. In one embodiment, they may be set to zero or remain unchanged depending on the masking mode of the instruction.

The following sequence of instruction may be executed to perform vectorized run-length encoding for an input vector ZMM_VALUE:

(1) ZMM1=VCONFLICT_SQR(ZMM_VALUE);
(2) ZMM2=VPAND(ZMM1, ZMM_MASK);
(3) K1=VPTESTNM(ZMM2);
(4) ZMM_VAL1=VCOMPRESS(K1, ZMM_VALUE);
(5) ZMM_COUNT=VMASKREDUCTIONCOMP_L (K1, ZMM_ALL_1S);

In the above sequence of instructions, ZMM_VALUE is the vector containing the sequence of values that is to be compressed (the input vector). In the above sequence of instructions, ZMM_MASK is a predefined (constant) mask that masks out bits from the output of the VCONFLICT_SQR instruction. In the above sequence of instructions, ZMM_ALL_1S is a predefined vector containing all binary '1's. In the above sequence of instructions, (1) is an instruction to perform a square conflict operation (e.g., take an element of an input vector and compare it to all other elements of the input vector; and repeat the same for all elements of the input vector). In the above sequence of instructions, (2) is an instruction to perform a bitwise logical AND operation. In the above sequence of instructions, (3) is an instruction to perform a vector packed test. In the above sequence of instructions, (4) is an instruction to perform vector compression. In the above sequence of instructions, (5) is an instruction to perform vector accumulation and compression. By combining vector accumulation and vector compression into a single instruction, the number of instructions for performing vectorized run-length encoding can be reduced.

FIG. 8 is a diagram illustrating a sequence of instructions being executed to perform vectorized run-length encoding for a vector containing duplicated runs using a left-border compression mask, according to some embodiments. In this example, ZMM_VALUE (the input vector) contains the sequence of values "AAABBAAB" (from LSB to MSB). It is to be noted that the conventional techniques for performing vectorized run-length encoding described above produced an incorrect result for this particular sequence of values (as illustrated in FIG. 4). The sequence of instructions described herein below, which utilizes a vector accumulation and compression instruction (e.g., VMASKREDUCTIONCOMP_L), however, produces the correct result for arbitrary input vectors (even when the input vector contains duplicated runs).

Executing the VCONFLICT_SQR(ZMM_VALUE) instruction produces ZMM1. ZMM_MASK_LEFT is a predefined left-border compression mask. Executing the VPAND(ZMM1, ZMM_MASK_LEFT) instruction produces ZMM2. Executing the VPTESTNM(ZMM2) instruction produces K1. Executing the VCOMPRESS(K1, ZMM_VALUE) instruction produces ZMM_VAL1. ZMM_ALL_1S is a predefined vector containing all binary '1's. Executing the VMASKREDUCTIONCOMP_L(K1, ZMM_ALL_1S) instruction produces ZMM_CNT1. As a result, ZMM_VAL1 contains the sequence of values "ABAB" and ZMM_CNT1 contains the sequence of corresponding counts "3221", which is the compressed form of the original sequence of values "AAABBAAB" contained in ZMM_VALUE. It should be noted that vectorized run-length encoding can be performed using a right-border compression mask (e.g., ZMM MASK RIGHT) instead of a left-border compression mask to produce the same result. In this case, the VMASKREDUCTIONCOMP_R instruction is executed in place of the VMASKREDUCTIONCOMP_L instruction.

Figure 9:
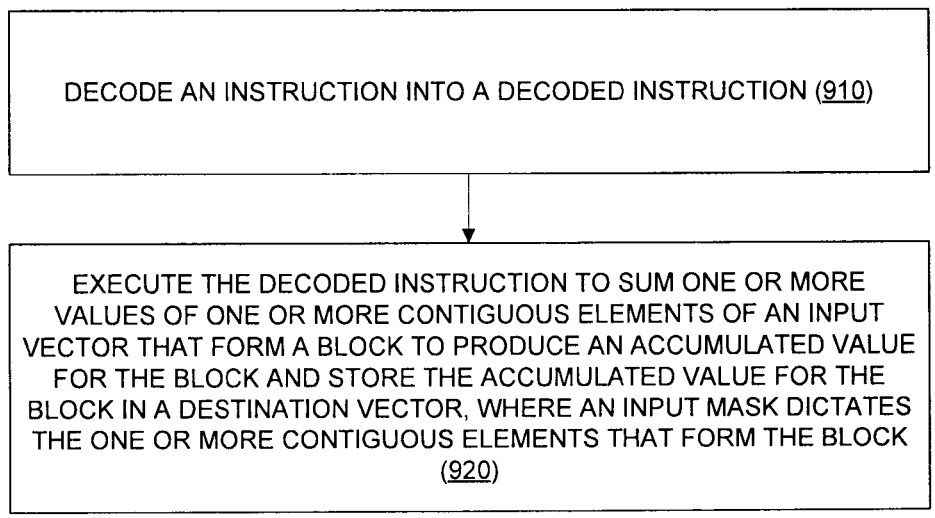
FIG. 9 is a flow diagram of a process for processing a vector accumulation instruction, according to some embodiments.

FIG. 9 is a flow diagram of a process for processing a vector accumulation instruction, according to some embodiments. The operations in the flow diagrams will be described with reference to the exemplary embodiments of the other figures. However, it should be understood that the operations of the flow diagrams can be performed by embodiments other than those discussed with reference to the other figures, and the embodiments discussed with reference to these other figures can perform operations different than those discussed with reference to the flow diagrams.

In one embodiment, the process is initiated when a decode circuit 102 decodes an instruction (e.g., a vector accumulation instruction or a vector accumulation and compression instruction) into a decoded instruction (block 910). An execution circuit 104 executes the decoded instruction to sum one or more values of one or more contiguous elements of an input vector that form a block to produce an accumulated value for the block and store the accumulated value for the block in a destination vector, where an input mask dictates the one or more contiguous elements of the input vector that form the block (block 920). In one embodiment, the execution circuit is to also sum one or more values of one or more other contiguous elements of the input vector that form a second block to produce an accumulated value for the second block and store the accumulated value for the second block in the destination vector, where the input mask dictates the one or more other contiguous elements that form the second block. In one embodiment, the execution circuit is to process the one or more contiguous elements of the input vector from left to right (e.g., MSB to LSB). In one embodiment, the execution circuit is to process the one or more contiguous elements of the input vector from right to left (e.g., LSB to MSB). In one embodiment, the input vector is a vector containing all binary '1's. This can be used to count the number of elements in each block. In one embodiment, a bit of the input mask is set to binary '1' to indicate a border of the block. When elements of the input vector are processed from left to right, a bit of the input mask set to binary '1' may indicate the right border of a block. When elements of the input vector are processed from right to left, a bit of the input mask set to binary '1' may indicate the left border of a block. In one embodiment, the execution circuit is to store the accumulated value for the block in an element of the destination vector corresponding to the bit of the input mask that is set to binary '1'. In one embodiment, the left or right border of a block may be indicated in the input mask using a binary '0' instead of a binary '1'. In one embodiment, the execution circuit is to store the accumulated value for the block in the destination vector in a compressed manner. In one embodiment, the instruction is a VMASKREDUCTION_L or VMASKREDUCTION_R instruction. In one embodiment, the instruction is a VMASKREDUCTIONCOMP_L or VMASKREDUCTIONCOMP_R instruction.

Instruction Sets

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 10A:
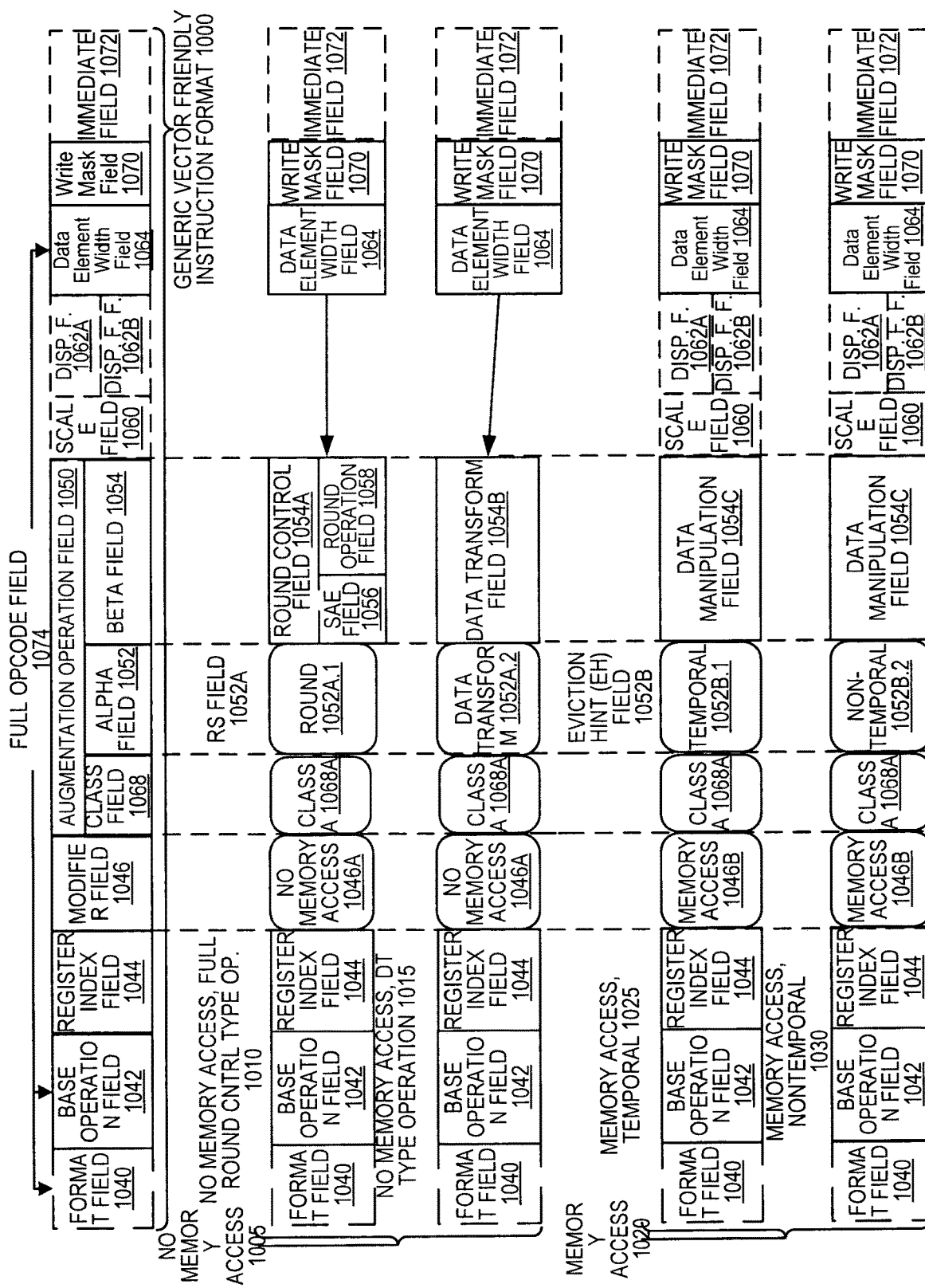
FIGS. 10A-10B are block diagrams illustrating a generic vector friendly instruction format and instruction templates thereof according to embodiments of the invention.
Figure 10B:
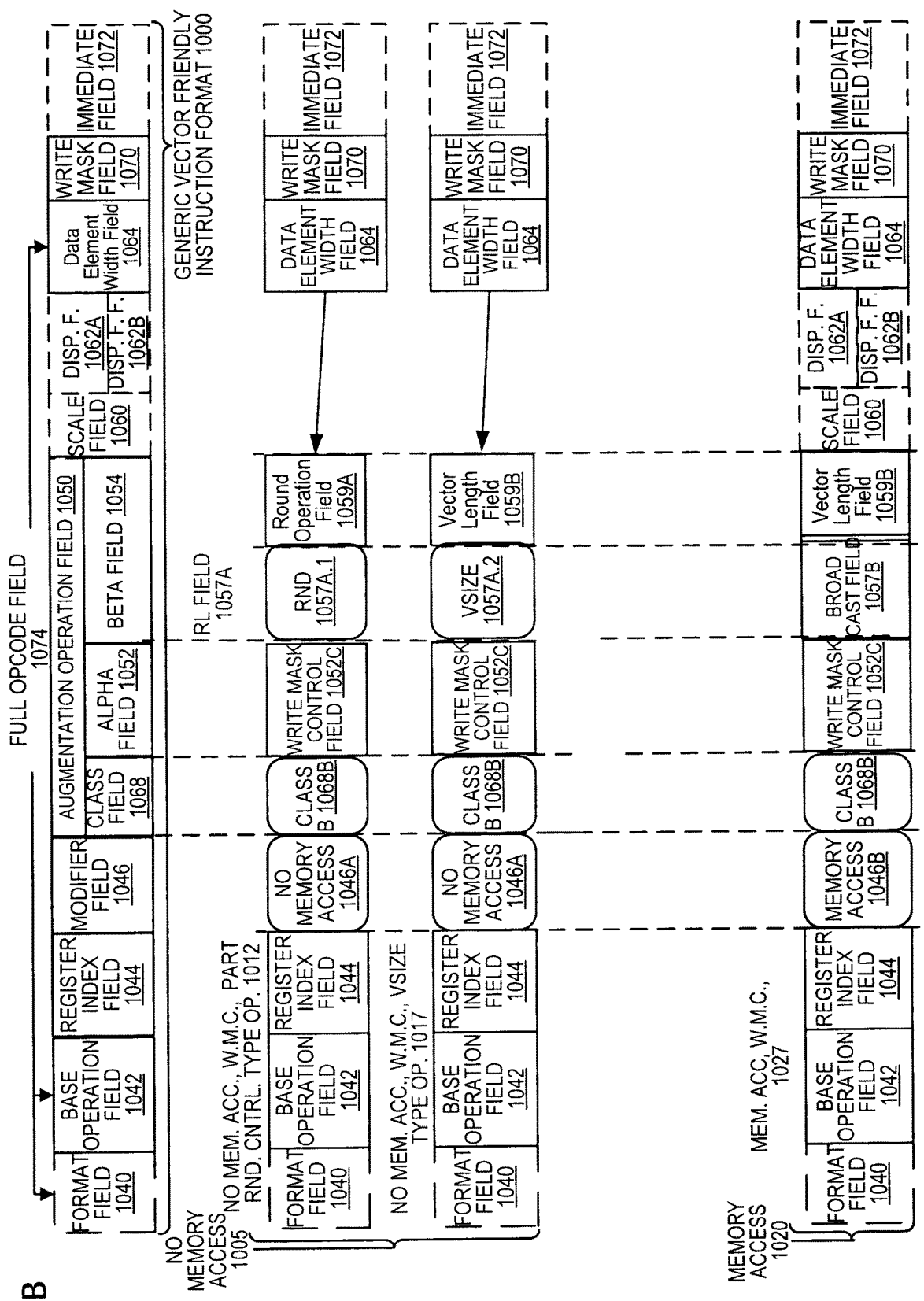

FIGS. 10A-10B are block diagrams illustrating a generic vector friendly instruction format and instruction templates thereof according to embodiments of the invention. FIG. 10A is a block diagram illustrating a generic vector friendly instruction format and class A instruction templates thereof according to embodiments of the invention; while FIG. 10B is a block diagram illustrating the generic vector friendly instruction format and class B instruction templates thereof according to embodiments of the invention. Specifically, a generic vector friendly instruction format 1000 for which are defined class A and class B instruction templates, both of which include no memory access 1005 instruction templates and memory access 1020 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 10A include: 1) within the no memory access 1005 instruction templates there is shown a no memory access, full round control type operation 1010 instruction template and a no memory access, data transform type operation 1015 instruction template; and 2) within the memory access 1020 instruction templates there is shown a memory access, temporal 1025 instruction template and a memory access, non-temporal 1030 instruction template. The class B instruction templates in FIG. 10B include: 1) within the no memory access 1005 instruction templates there is shown a no memory access, write mask control, partial round control type operation 1012 instruction template and a no memory access, write mask control, vsize type operation 1017 instruction template; and 2) within the memory access 1020 instruction templates there is shown a memory access, write mask control 1027 instruction template.

The generic vector friendly instruction format 1000 includes the following fields listed below in the order illustrated in FIGS. 10A-10B.

Format field 1040—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 1042—its content distinguishes different base operations.

Register index field 1044—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 1046—its content distinguishes occurrences of instructions in the generic vector instruction format that specify memory access from those that do not; that is, between no memory access 1005 instruction templates and memory access 1020 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 1050—its content distinguishes which one of a variety of different operations to be performed in addition to the base operation. This field is context specific. In one embodiment of the invention, this field is divided into a class field 1068, an alpha field 1052, and a beta field 1054. The augmentation operation field 1050 allows common groups of operations to be performed in a single instruction rather than 2, 3, or 4 instructions.

Scale field 1060—its content allows for the scaling of the index field's content for memory address generation (e.g., for address generation that uses $2^{scale}*index+base$).

Displacement Field 1062A—its content is used as part of memory address generation (e.g., for address generation that uses $2^{scale}*index+base+displacement$).

Displacement Factor Field 1062B (note that the juxtaposition of displacement field 1062A directly over displacement factor field 1062B indicates one or the other is used)—its content is used as part of address generation; it specifies a displacement factor that is to be scaled by the size of a memory access (N)—where N is the number of bytes in the memory access (e.g., for address generation that uses $2^{scale}*index+base+scaled\ displacement$). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 1074 (described later herein) and the data manipulation field 1054C. The displacement field 1062A and the displacement factor field 1062B are optional in the sense that they are not used for the no memory access 1005 instruction templates and/or different embodiments may implement only one or none of the two.

Data element width field 1064—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 1070—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 1070 allows for partial vector operations, including loads, stores, arithmetic, logical, etc. While embodiments of the invention are described in which the write mask field's 1070 content selects one of a number of write mask registers that contains the write mask to be used (and thus the write mask field's 1070 content indirectly identifies that masking to be performed), alternative embodiments instead or additional allow the mask write field's 1070 content to directly specify the masking to be performed.

Immediate field 1072—its content allows for the specification of an immediate. This field is optional in the sense that is it not present in an implementation of the generic vector friendly format that does not support immediate and it is not present in instructions that do not use an immediate.

Class field 1068—its content distinguishes between different classes of instructions. With reference to FIGS. 10A-B, the contents of this field select between class A and class B instructions. In FIGS. 10A-B, rounded corner squares are used to indicate a specific value is present in a field (e.g., class A 1068A and class B 1068B for the class field 1068 respectively in FIGS. 10A-B).

Instruction Templates of Class A

In the case of the non-memory access 1005 instruction templates of class A, the alpha field 1052 is interpreted as an RS field 1052A, whose content distinguishes which one of the different augmentation operation types are to be performed (e.g., round 1052A.1 and data transform 1052A.2 are respectively specified for the no memory access, round type operation 1010 and the no memory access, data transform type operation 1015 instruction templates), while the beta field 1054 distinguishes which of the operations of the specified type is to be performed. In the no memory access 1005 instruction templates, the scale field 1060, the displacement field 1062A, and the displacement scale filed 1062B are not present.

No-Memory Access Instruction Templates—Full Round Control Type Operation

In the no memory access full round control type operation 1010 instruction template, the beta field 1054 is interpreted as a round control field 1054A, whose content(s) provide static rounding. While in the described embodiments of the invention the round control field 1054A includes a suppress all floating point exceptions (SAE) field 1056 and a round operation control field 1058, alternative embodiments may support may encode both these concepts into the same field or only have one or the other of these concepts/fields (e.g., may have only the round operation control field 1058).

SAE field 1056—its content distinguishes whether or not to disable the exception event reporting; when the SAE field's 1056 content indicates suppression is enabled, a given instruction does not report any kind of floating-point exception flag and does not raise any floating point exception handler.

Round operation control field 1058—its content distinguishes which one of a group of rounding operations to perform (e.g., Round-up, Round-down, Round-towards-zero and Round-to-nearest). Thus, the round operation control field 1058 allows for the changing of the rounding mode on a per instruction basis. In one embodiment of the invention where a processor includes a control register for specifying rounding modes, the round operation control field's 1050 content overrides that register value.

No Memory Access Instruction Templates—Data Transform Type Operation

In the no memory access data transform type operation 1015 instruction template, the beta field 1054 is interpreted as a data transform field 1054B, whose content distinguishes which one of a number of data transforms is to be performed (e.g., no data transform, swizzle, broadcast).

In the case of a memory access 1020 instruction template of class A, the alpha field 1052 is interpreted as an eviction hint field 1052B, whose content distinguishes which one of the eviction hints is to be used (in FIG. 10A, temporal 1052B.1 and non-temporal 1052B.2 are respectively specified for the memory access, temporal 1025 instruction template and the memory access, non-temporal 1030 instruction template), while the beta field 1054 is interpreted as a data manipulation field 1054C, whose content distinguishes which one of a number of data manipulation operations (also known as primitives) is to be performed (e.g., no manipulation; broadcast; up conversion of a source; and down conversion of a destination). The memory access 1020 instruction templates include the scale field 1060, and optionally the displacement field 1062A or the displacement scale field 1062B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 1052 is interpreted as a write mask control (Z) field 1052C, whose content distinguishes whether the write masking controlled by the write mask field 1070 should be a merging or a zeroing.

In the case of the non-memory access 1005 instruction templates of class B, part of the beta field 1054 is interpreted as an RL field 1057A, whose content distinguishes which one of the different augmentation operation types are to be performed (e.g., round 1057A.1 and vector length (VSIZE) 1057A.2 are respectively specified for the no memory access, write mask control, partial round control type operation 1012 instruction template and the no memory access, write mask control, VSIZE type operation 1017 instruction template), while the rest of the beta field 1054 distinguishes which of the operations of the specified type is to be performed. In the no memory access 1005 instruction templates, the scale field 1060, the displacement field 1062A, and the displacement scale filed 1062B are not present.

In the no memory access, write mask control, partial round control type operation 1010 instruction template, the rest of the beta field 1054 is interpreted as a round operation field 1059A and exception event reporting is disabled (a given instruction does not report any kind of floating-point exception flag and does not raise any floating point exception handler).

Round operation control field 1059A—just as round operation control field 1058, its content distinguishes which one of a group of rounding operations to perform (e.g., Round-up, Round-down, Round-towards-zero and Round-to-nearest). Thus, the round operation control field 1059A allows for the changing of the rounding mode on a per instruction basis. In one embodiment of the invention where a processor includes a control register for specifying rounding modes, the round operation control field's 1050 content overrides that register value.

In the no memory access, write mask control, VSIZE type operation 1017 instruction template, the rest of the beta field 1054 is interpreted as a vector length field 1059B, whose content distinguishes which one of a number of data vector lengths is to be performed on (e.g., 128, 256, or 512 byte).

In the case of a memory access 1020 instruction template of class B, part of the beta field 1054 is interpreted as a broadcast field 1057B, whose content distinguishes whether or not the broadcast type data manipulation operation is to be performed, while the rest of the beta field 1054 is interpreted the vector length field 1059B. The memory access 1020 instruction templates include the scale field 1060, and optionally the displacement field 1062A or the displacement scale field 1062B.

With regard to the generic vector friendly instruction format 1000, a full opcode field 1074 is shown including the format field 1040, the base operation field 1042, and the data element width field 1064. While one embodiment is shown where the full opcode field 1074 includes all of these fields, the full opcode field 1074 includes less than all of these fields in embodiments that do not support all of them. The full opcode field 1074 provides the operation code (opcode).

The augmentation operation field 1050, the data element width field 1064, and the write mask field 1070 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 11A is a block diagram illustrating an exemplary specific vector friendly instruction format according to embodiments of the invention. FIG. 11A shows a specific vector friendly instruction format 1100 that is specific in the sense that it specifies the location, size, interpretation, and order of the fields, as well as values for some of those fields. The specific vector friendly instruction format 1100 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 10 into which the fields from FIG. 11A map are illustrated.

It should be understood that, although embodiments of the invention are described with reference to the specific vector friendly instruction format 1100 in the context of the generic vector friendly instruction format 1000 for illustrative purposes, the invention is not limited to the specific vector friendly instruction format 1100 except where claimed. For example, the generic vector friendly instruction format 1000 contemplates a variety of possible sizes for the various fields, while the specific vector friendly instruction format 1100 is shown as having fields of specific sizes. By way of specific example, while the data element width field 1064 is illustrated as a one bit field in the specific vector friendly instruction format 1100, the invention is not so limited (that is, the generic vector friendly instruction format 1000 contemplates other sizes of the data element width field 1064).

The generic vector friendly instruction format 1000 includes the following fields listed below in the order illustrated in FIG. 11A.

EVEX Prefix (Bytes 0-3) 1102—is encoded in a four-byte form.

Format Field 1040 (EVEX Byte 0, bits [7:0])—the first byte (EVEX Byte 0) is the format field 1040 and it contains 0×62 (the unique value used for distinguishing the vector friendly instruction format in one embodiment of the invention).

The second-fourth bytes (EVEX Bytes 1-3) include a number of bit fields providing specific capability.

REX field 1105 (EVEX Byte 1, bits [7-5])—consists of a EVEX.R bit field (EVEX Byte 1, bit [7]-R), EVEX.X bit field (EVEX byte 1, bit [6]-X), and 1057BEX byte 1, bit[5]-B). The EVEX.R, EVEX.X, and EVEX.B bit fields provide the same functionality as the corresponding VEX bit fields, and are encoded using 1s complement form, i.e.

ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 1010—this is the first part of the REX' field 1010 and is the EVEX.R' bit field (EVEX Byte 1, bit [4]-R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 1115 (EVEX byte 1, bits [3:0]-mmmm)—its content encodes an implied leading opcode byte (0F, 0F 38, or 0F 3).

Data element width field 1064 (EVEX byte 2, bit [7]-W)—is represented by the notation EVEX.W. EVEX.W is used to define the granularity (size) of the datatype (either 32-bit data elements or 64-bit data elements).

EVEX.vvvv 1120 (EVEX Byte 2, bits [6:3]-vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 1120 encodes the 4 low-order bits of the first source register specifier stored in inverted (1s complement) form. Depending on the instruction, an extra different EVEX bit field is used to extend the specifier size to 32 registers.

EVEX.U 1068 Class field (EVEX byte 2, bit [2]-U)—If EVEX.U=0, it indicates class A or EVEX.U0; if EVEX.U=1, it indicates class B or EVEX.U1.

Prefix encoding field 1125 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 1052 (EVEX byte 3, bit [7]—EH; also known as EVEX.EH, EVEX.rs, EVEX.RL, EVEX.write mask control, and EVEX.N; also illustrated with α)—as previously described, this field is context specific.

Beta field 1054 (EVEX byte 3, bits [6:4]-SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' field 1010—this is the remainder of the REX' field and is the EVEX.V' bit field (EVEX Byte 3, bit [3]-V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 1070 (EVEX byte 3, bits [2:0]-kkk)—its content specifies the index of a register in the write mask registers as previously described. In one embodiment of the invention, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 1130 (Byte 4) is also known as the opcode byte. Part of the opcode is specified in this field.

MOD R/M Field 1140 (Byte 5) includes MOD field 1142, Reg field 1144, and R/M field 1146. As previously described, the MOD field's 1142 content distinguishes between memory access and non-memory access operations. The role of Reg field 1144 can be summarized to two situations: encoding either the destination register operand or a source register operand, or be treated as an opcode extension and not used to encode any instruction operand. The role of R/M field 1146 may include the following: encoding the instruction operand that references a memory address, or encoding either the destination register operand or a source register operand.

Scale, Index, Base (SIB) Byte (Byte 6)—As previously described, the scale field's 1050 content is used for memory address generation. SIB.xxx 1154 and SIB.bbb 1156—the contents of these fields have been previously referred to with regard to the register indexes Xxxx and Bbbb.

Displacement field 1062A (Bytes 7-10)—when MOD field 1142 contains 10, bytes 7-10 are the displacement field 1062A, and it works the same as the legacy 32-bit displacement (disp32) and works at byte granularity.

Displacement factor field 1062B (Byte 7)—when MOD field 1142 contains 01, byte 7 is the displacement factor field 1062B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 1062B is a reinterpretation of disp8; when using displacement factor field 1062B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 1062B substitutes the legacy x86 instruction set 8-bit displacement. Thus, the displacement factor field 1062B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 1072 operates as previously described.

Full Opcode Field

FIG. 11B is a block diagram illustrating the fields of the specific vector friendly instruction format 1100 that make up the full opcode field 1074 according to one embodiment of the invention. Specifically, the full opcode field 1074 includes the format field 1040, the base operation field 1042, and the data element width (W) field 1064. The base operation field 1042 includes the prefix encoding field 1125, the opcode map field 1115, and the real opcode field 1130.

Register Index Field

FIG. 11C is a block diagram illustrating the fields of the specific vector friendly instruction format 1100 that make up the register index field 1044 according to one embodiment of the invention. Specifically, the register index field 1044 includes the REX field 1105, the REX' field 1110, the MODR/M.reg field 1144, the MODR/M.r/m field 1146, the VVVV field 1120, xxx field 1154, and the bbb field 1156.

Augmentation Operation Field

Figure 11D:
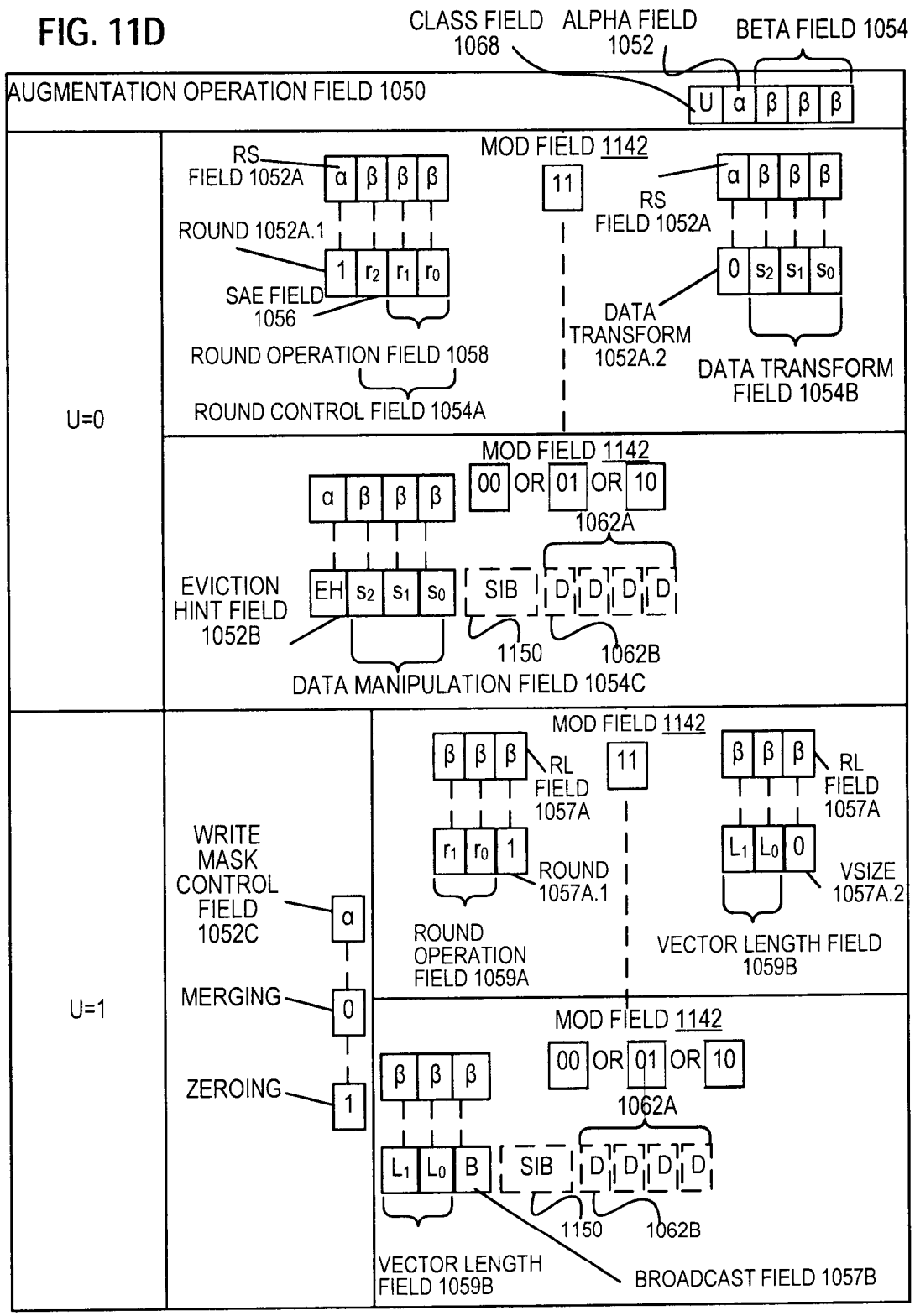
FIG. 11D is a block diagram illustrating the fields of the specific vector friendly instruction format 1100 that make up the augmentation operation field 1050 according to one embodiment of the invention.

FIG. 11D is a block diagram illustrating the fields of the specific vector friendly instruction format 1100 that make up the augmentation operation field 1050 according to one embodiment of the invention. When the class (U) field 1068 contains 0, it signifies EVEX.U0 (class A 1068A); when it contains 1, it signifies EVEX.U1 (class B 1068B). When U=0 and the MOD field 1142 contains 11 (signifying a no memory access operation), the alpha field 1052 (EVEX byte 3, bit [7]-EH) is interpreted as the rs field 1052A. When the rs field 1052A contains a 1 (round 1052A.1), the beta field 1054 (EVEX byte 3, bits [6:4]-SSS) is interpreted as the round control field 1054A. The round control field 1054A includes a one bit SAE field 1056 and a two bit round operation field 1058. When the rs field 1052A contains a 0 (data transform 1052A.2), the beta field 1054 (EVEX byte 3, bits [6:4]-SSS) is interpreted as a three bit data transform field 1054B. When U=0 and the MOD field 1142 contains 00, 01, or 10 (signifying a memory access operation), the alpha field 1052 (EVEX byte 3, bit [7]-EH) is interpreted as the eviction hint (EH) field 1052B and the beta field 1054 (EVEX byte 3, bits [6:4]-SSS) is interpreted as a three bit data manipulation field 1054C.

When U=1, the alpha field 1052 (EVEX byte 3, bit [7]-EH) is interpreted as the write mask control (Z) field 1052C. When U=1 and the MOD field 1142 contains 11 (signifying a no memory access operation), part of the beta field 1054 (EVEX byte 3, bit [4]-$S_0$) is interpreted as the RL field 1057A; when it contains a 1 (round 1057A.1) the rest of the beta field 1054 (EVEX byte 3, bit [6-5]-$S_{2-1}$) is interpreted as the round operation field 1059A, while when the RL field 1057A contains a 0 (VSIZE 1057.A2) the rest of the beta field 1054 (EVEX byte 3, bit [6-5]-$S_{2-1}$) is interpreted as the vector length field 1059B (EVEX byte 3, bit [6-5]-$L_{1-10}$). When U=1 and the MOD field 1142 contains 00, 01, or 10 (signifying a memory access operation), the beta field 1054 (EVEX byte 3, bits [6:4]-SSS) is interpreted as the vector length field 1059B (EVEX byte 3, bit [6-5]-$L_{1-0}$) and the broadcast field 1057B (EVEX byte 3, bit [4]-B).

Exemplary Register Architecture

FIG. 12 is a block diagram of a register architecture 1200 according to one embodiment of the invention. In the embodiment illustrated, there are 32 vector registers 1210 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 1100 operates on these overlaid register file as illustrated in the below tables.

| Adjustable Vector Length | Class | Operations | Registers |
|---|---|---|---|
| Instruction Templates that do not include the vector length field 1059B | A (FIG. 10A; U = 0) | 1010, 1015, 1025, 1030 | zmm registers (the vector length is 64 byte) |
|  | B (FIG. 10B; U = 1) | 1012 | zmm registers (the vector length is 64 byte) |
| Instruction templates that do include the vector length field 1059B | B (FIG. 10B; U = 1) | 1017, 1027 | zmm, ymm, or xmm registers (the vector length is 64 byte, 32 byte, or 16 byte) depending on the vector length field 1059B |

In other words, the vector length field 1059B selects between a maximum length and one or more other shorter lengths, where each such shorter length is half the length of the preceding length; and instructions templates without the vector length field 1059B operate on the maximum vector length. Further, in one embodiment, the class B instruction templates of the specific vector friendly instruction format 1100 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 1215—in the embodiment illustrated, there are 8 write mask registers (k0 through k7), each 64 bits in size. In an alternate embodiment, the write mask registers 1215 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 1225—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 1245, on which is aliased the MMX packed integer flat register file 1250—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 13A is a block diagram illustrating both an exemplary in-order pipeline and an exemplary register renaming, out-of-order issue/execution pipeline according to embodiments of the invention. FIG. 13B is a block diagram illustrating both an exemplary embodiment of an in-order architecture core and an exemplary register renaming, out-of-order issue/execution architecture core to be included in a processor according to embodiments of the invention. The solid lined boxes in FIGS. 13A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 13A, a processor pipeline 1300 includes a fetch stage 1302, a length decode stage 1304, a decode stage 1306, an allocation stage 1308, a renaming stage 1310, a scheduling (also known as a dispatch or issue) stage 1312, a register read/memory read stage 1314, an execute stage 1316, a write back/memory write stage 1318, an exception handling stage 1322, and a commit stage 1324.

FIG. 13B shows processor core 1390 including a front end unit 1330 coupled to an execution engine unit 1350, and both are coupled to a memory unit 1370. The core 1390 may be a reduced instruction set computing (RISC) core, a complex instruction set computing (CISC) core, a very long instruction word (VLIW) core, or a hybrid or alternative core type. As yet another option, the core 1390 may be a special-purpose core, such as, for example, a network or communication core, compression engine, coprocessor core, general purpose computing graphics processing unit (GPGPU) core, graphics core, or the like.

The front end unit 1330 includes a branch prediction unit 1332 coupled to an instruction cache unit 1334, which is coupled to an instruction translation lookaside buffer (TLB) 1336, which is coupled to an instruction fetch unit 1338, which is coupled to a decode unit 1340. The decode unit 1340 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1340 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1390 includes a microcode ROM or other medium that stores microcode for certain macroinstructions (e.g., in decode unit 1340 or otherwise within the front end unit 1330). The decode unit 1340 is coupled to a rename/allocator unit 1352 in the execution engine unit 1350.

The execution engine unit 1350 includes the rename/allocator unit 1352 coupled to a retirement unit 1354 and a set of one or more scheduler unit(s) 1356. The scheduler unit(s) 1356 represents any number of different schedulers, including reservations stations, central instruction window, etc. The scheduler unit(s) 1356 is coupled to the physical register file(s) unit(s) 1358. Each of the physical register file(s) units 1358 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1358 comprises a vector registers unit, a write mask registers unit, and a scalar registers unit. These register units may provide architectural vector registers, vector mask registers, and general purpose registers. The physical register file(s) unit(s) 1358 is overlapped by the retirement unit 1354 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1354 and the physical register file(s) unit(s) 1358 are coupled to the execution cluster(s) 1360. The execution cluster(s) 1360 includes a set of one or more execution units 1362 and a set of one or more memory access units 1364. The execution units 1362 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1356, physical register file(s) unit(s) 1358, and execution cluster(s) 1360 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1364). It should also be understood that where separate pipelines are used, one or more of these pipelines may be out-of-order issue/execution and the rest in-order.

The set of memory access units 1364 is coupled to the memory unit 1370, which includes a data TLB unit 1372 coupled to a data cache unit 1374 coupled to a level 2 (L2) cache unit 1376. In one exemplary embodiment, the memory access units 1364 may include a load unit, a store address unit, and a store data unit, each of which is coupled to the data TLB unit 1372 in the memory unit 1370. The instruction cache unit 1334 is further coupled to a level 2 (L2) cache unit 1376 in the memory unit 1370. The L2 cache unit 1376 is coupled to one or more other levels of cache and eventually to a main memory.

By way of example, the exemplary register renaming, out-of-order issue/execution core architecture may implement the pipeline 1300 as follows: 1) the instruction fetch 1338 performs the fetch and length decoding stages 1302 and 1304; 2) the decode unit 1340 performs the decode stage 1306; 3) the rename/allocator unit 1352 performs the allocation stage 1308 and renaming stage 1310; 4) the scheduler unit(s) 1356 performs the schedule stage 1312; 5) the physical register file(s) unit(s) 1358 and the memory unit 1370 perform the register read/memory read stage 1314; the execution cluster 1360 perform the execute stage 1316; 6) the memory unit 1370 and the physical register file(s) unit(s) 1358 perform the write back/memory write stage 1318; 7) various units may be involved in the exception handling stage 1322; and 8) the retirement unit 1354 and the physical register file(s) unit(s) 1358 perform the commit stage 1324.

The core 1390 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1390 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1334/1374 and a shared L2 cache unit 1376, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

FIGS. 14A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 14A is a block diagram of a single processor core, along with its connection to the on-die interconnect network 1402 and with its local subset of the Level 2 (L2) cache 1404, according to embodiments of the invention. In one embodiment, an instruction decoder 1400 supports the x86 instruction set with a packed data instruction set extension. An L1 cache 1406 allows low-latency accesses to cache memory into the scalar and vector units. While in one embodiment (to simplify the design), a scalar unit 1408 and a vector unit 1410 use separate register sets (respectively, scalar registers 1412 and vector registers 1414) and data transferred between them is written to memory and then read back in from a level 1 (L1) cache 1406, alternative embodiments of the invention may use a different approach (e.g., use a single register set or include a communication path that allow data to be transferred between the two register files without being written and read back).

The local subset of the L2 cache 1404 is part of a global L2 cache that is divided into separate local subsets, one per processor core. Each processor core has a direct access path to its own local subset of the L2 cache 1404. Data read by a processor core is stored in its L2 cache subset 1404 and can be accessed quickly, in parallel with other processor cores accessing their own local L2 cache subsets. Data written by a processor core is stored in its own L2 cache subset 1404 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 14B is an expanded view of part of the processor core in FIG. 14A according to embodiments of the invention. FIG. 14B includes an L1 data cache 1406A part of the L1 cache 1404, as well as more detail regarding the vector unit 1410 and the vector registers 1414. Specifically, the vector unit 1410 is a 16-wide vector processing unit (VPU) (see the 16-wide ALU 1428), which executes one or more of integer, single-precision float, and double-precision float instructions. The VPU supports swizzling the register inputs with swizzle unit 1420, numeric conversion with numeric convert units 1422A-B, and replication with replication unit 1424 on the memory input. Write mask registers 1426 allow predicating resulting vector writes.

Figure 15:
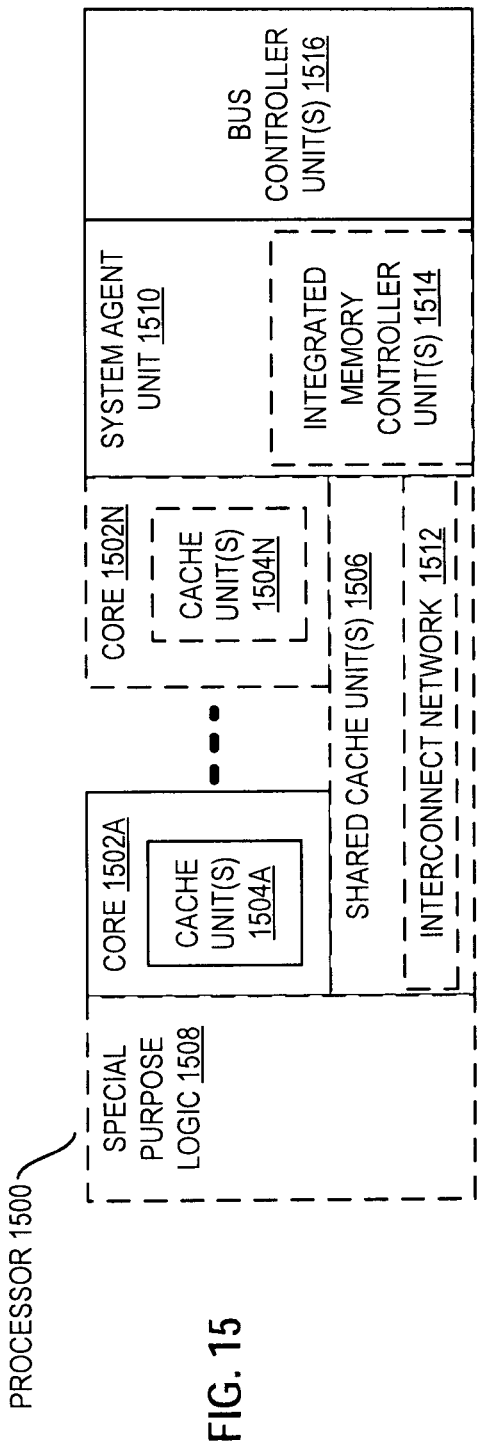
FIG. 15 is a block diagram of a processor 1500 that may have more than one core, may have an integrated memory controller, and may have integrated graphics according to embodiments of the invention.

FIG. 15 is a block diagram of a processor 1500 that may have more than one core, may have an integrated memory controller, and may have integrated graphics according to embodiments of the invention. The solid lined boxes in FIG. 15 illustrate a processor 1500 with a single core 1502A, a system agent 1510, a set of one or more bus controller units 1516, while the optional addition of the dashed lined boxes illustrates an alternative processor 1500 with multiple cores 1502A-N, a set of one or more integrated memory controller unit(s) 1514 in the system agent unit 1510, and special purpose logic 1508.

Thus, different implementations of the processor 1500 may include: 1) a CPU with the special purpose logic 1508 being integrated graphics and/or scientific (throughput) logic (which may include one or more cores), and the cores 1502A-N being one or more general purpose cores (e.g., general purpose in-order cores, general purpose out-of-order cores, a combination of the two); 2) a coprocessor with the cores 1502A-N being a large number of special purpose cores intended primarily for graphics and/or scientific (throughput); and 3) a coprocessor with the cores 1502A-N being a large number of general purpose in-order cores. Thus, the processor 1500 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1500 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1506, and external memory (not shown) coupled to the set of integrated memory controller units 1514. The set of shared cache units 1506 may include one or more mid-level caches, such as level 2 (L2), level 3 (L3), level 4 (L4), or other levels of cache, a last level cache (LLC), and/or combinations thereof. While in one embodiment a ring based interconnect unit 1512 interconnects the integrated graphics logic 1508 (integrated graphics logic 1508 is an example of and is also referred to herein as special purpose logic), the set of shared cache units 1506, and the system agent unit 1510/integrated memory controller unit(s) 1514, alternative embodiments may use any number of well-known techniques for interconnecting such units. In one embodiment, coherency is maintained between one or more cache units 1506 and cores 1502-A-N.

In some embodiments, one or more of the cores 1502A-N are capable of multi-threading. The system agent 1510 includes those components coordinating and operating cores 1502A-N. The system agent unit 1510 may include for example a power control unit (PCU) and a display unit. The PCU may be or include logic and components needed for regulating the power state of the cores 1502A-N and the integrated graphics logic 1508. The display unit is for driving one or more externally connected displays.

The cores 1502A-N may be homogenous or heterogeneous in terms of architecture instruction set; that is, two or more of the cores 1502A-N may be capable of execution the same instruction set, while others may be capable of executing only a subset of that instruction set or a different instruction set.

Exemplary Computer Architectures

FIGS. 16-19 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 16:
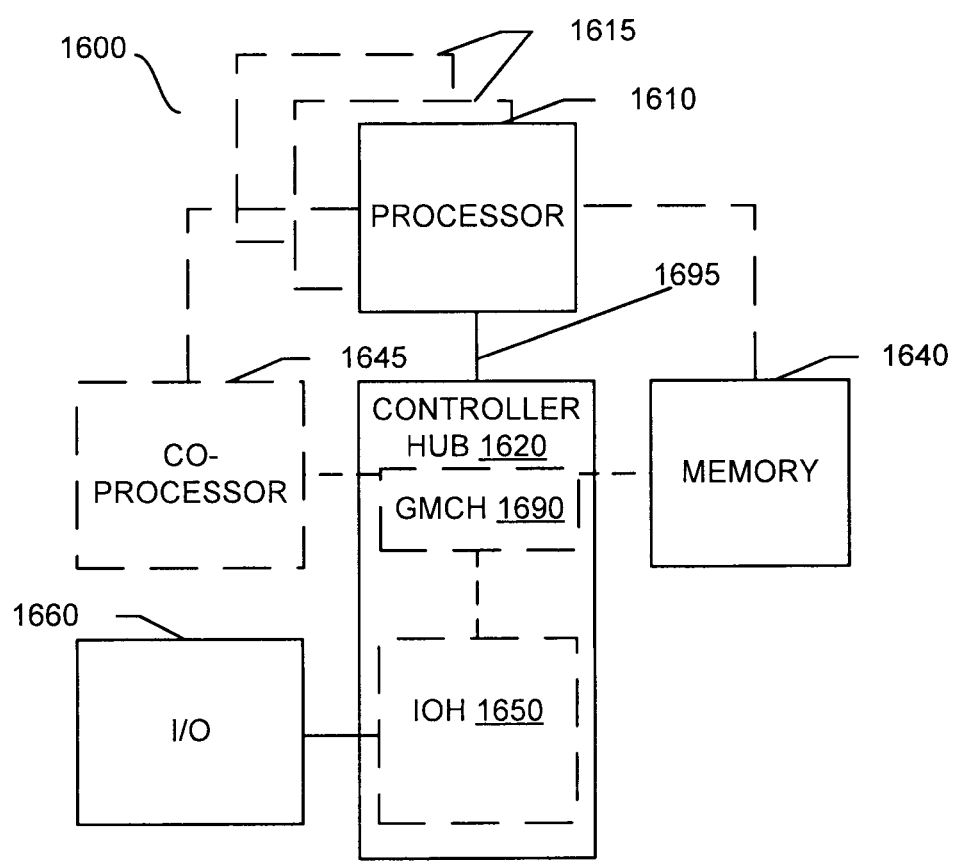
FIGS. 16-19 are block diagrams of exemplary computer architectures.

Referring now to FIG. 16, shown is a block diagram of a system 1600 in accordance with one embodiment of the present invention. The system 1600 may include one or more processors 1610, 1615, which are coupled to a controller hub 1620. In one embodiment the controller hub 1620 includes a graphics memory controller hub (GMCH) 1690 and an Input/Output Hub (IOH) 1650 (which may be on separate chips); the GMCH 1690 includes memory and graphics controllers to which are coupled memory 1640 and a coprocessor 1645; the IOH 1650 couples input/output (I/O) devices 1660 to the GMCH 1690. Alternatively, one or both of the memory and graphics controllers are integrated within the processor (as described herein), the memory 1640 and the coprocessor 1645 are coupled directly to the processor 1610, and the controller hub 1620 in a single chip with the IOH 1650.

The optional nature of additional processors 1615 is denoted in FIG. 16 with broken lines. Each processor 1610, 1615 may include one or more of the processing cores described herein and may be some version of the processor 1500.

The memory 1640 may be, for example, dynamic random access memory (DRAM), phase change memory (PCM), or a combination of the two. For at least one embodiment, the controller hub 1620 communicates with the processor(s) 1610, 1615 via a multi-drop bus, such as a frontside bus (FSB), point-to-point interface such as QuickPath Interconnect (QPI), or similar connection 1695.

In one embodiment, the coprocessor 1645 is a special-purpose processor, such as, for example, a high-throughput MIC processor, a network or communication processor, compression engine, graphics processor, GPGPU, embedded processor, or the like. In one embodiment, controller hub 1620 may include an integrated graphics accelerator.

There can be a variety of differences between the physical resources 1610, 1615 in terms of a spectrum of metrics of merit including architectural, microarchitectural, thermal, power consumption characteristics, and the like.

In one embodiment, the processor 1610 executes instructions that control data processing operations of a general type. Embedded within the instructions may be coprocessor instructions. The processor 1610 recognizes these coprocessor instructions as being of a type that should be executed by the attached coprocessor 1645. Accordingly, the processor 1610 issues these coprocessor instructions (or control signals representing coprocessor instructions) on a coprocessor bus or other interconnect, to coprocessor 1645. Coprocessor(s) 1645 accept and execute the received coprocessor instructions.

Figure 17:
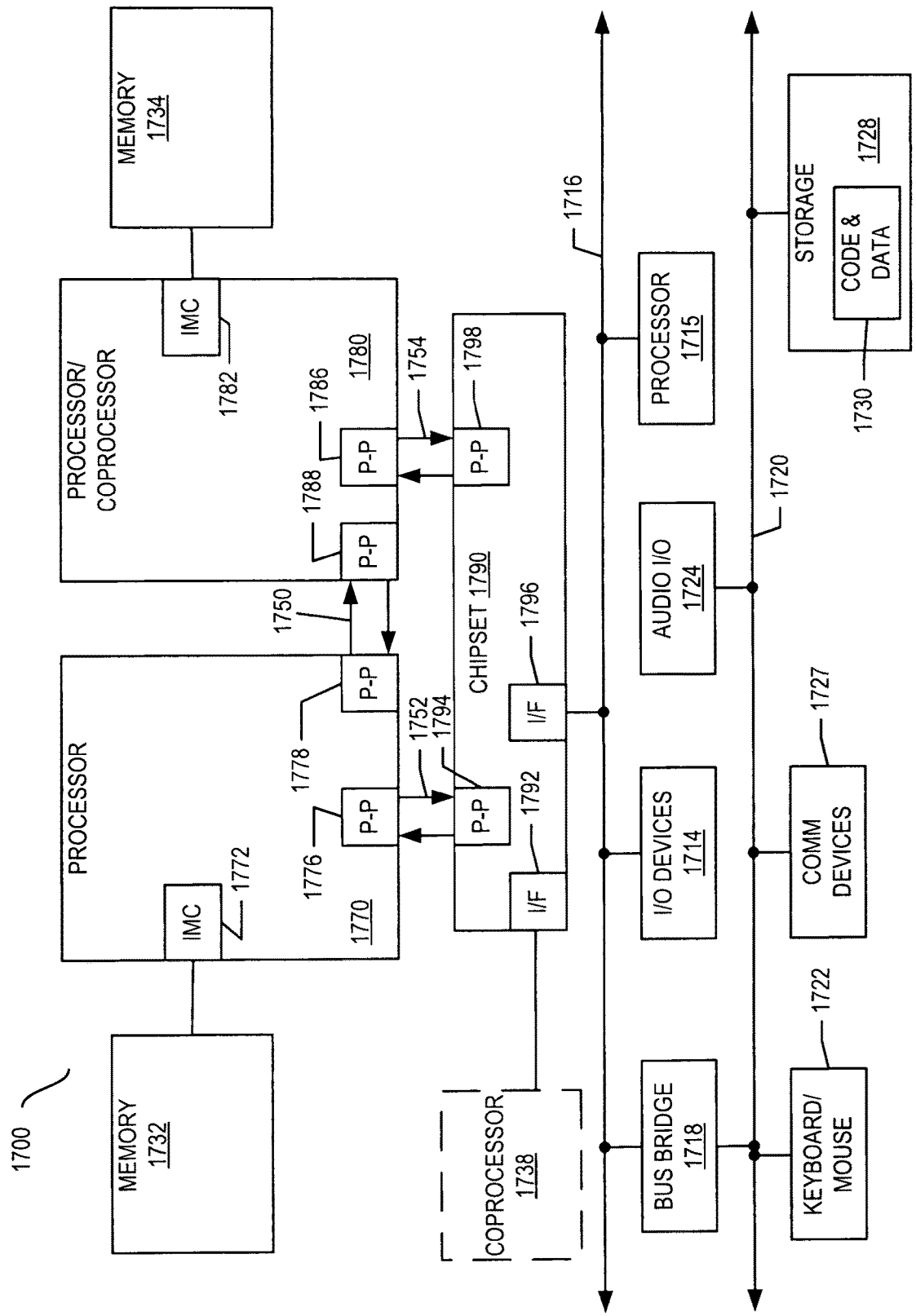

Referring now to FIG. 17, shown is a block diagram of a first more specific exemplary system 1700 in accordance with an embodiment of the present invention. As shown in FIG. 17, multiprocessor system 1700 is a point-to-point interconnect system, and includes a first processor 1770 and a second processor 1780 coupled via a point-to-point interconnect 1750. Each of processors 1770 and 1780 may be some version of the processor 1500. In one embodiment of the invention, processors 1770 and 1780 are respectively processors 1610 and 1615, while coprocessor 1738 is coprocessor 1645. In another embodiment, processors 1770 and 1780 are respectively processor 1610 coprocessor 1645.

Processors 1770 and 1780 are shown including integrated memory controller (IMC) units 1772 and 1782, respectively. Processor 1770 also includes as part of its bus controller units point-to-point (P-P) interfaces 1776 and 1778; similarly, second processor 1780 includes P-P interfaces 1786 and 1788. Processors 1770, 1780 may exchange information via a point-to-point (P-P) interface 1750 using P-P interface circuits 1778, 1788. As shown in FIG. 17, IMCs 1772 and 1782 couple the processors to respective memories, namely a memory 1732 and a memory 1734, which may be portions of main memory locally attached to the respective processors.

Processors 1770, 1780 may each exchange information with a chipset 1790 via individual P-P interfaces 1752, 1754 using point to point interface circuits 1776, 1794, 1786, 1798. Chipset 1790 may optionally exchange information with the coprocessor 1738 via a high-performance interface 1792. In one embodiment, the coprocessor 1738 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1790 may be coupled to a first bus 1716 via an interface 1796. In one embodiment, first bus 1716 may be a Peripheral Component Interconnect (PCI) bus, or a bus such as a PCI Express bus or another third generation I/O interconnect bus, although the scope of the present invention is not so limited.

As shown in FIG. 17, various I/O devices 1714 may be coupled to first bus 1716, along with a bus bridge 1718 which couples first bus 1716 to a second bus 1720. In one embodiment, one or more additional processor(s) 1715, such as coprocessors, high-throughput MIC processors, GPGPU's, accelerators (such as, e.g., graphics accelerators or digital signal processing (DSP) units), field programmable gate arrays, or any other processor, are coupled to first bus 1716. In one embodiment, second bus 1720 may be a low pin count (LPC) bus. Various devices may be coupled to a second bus 1720 including, for example, a keyboard and/or mouse 1722, communication devices 1727 and a storage unit 1728 such as a disk drive or other mass storage device which may include instructions/code and data 1730, in one embodiment. Further, an audio I/O 1724 may be coupled to the second bus 1720. Note that other architectures are possible. For example, instead of the point-to-point architecture of FIG. 17, a system may implement a multi-drop bus or other such architecture.

Figure 18:
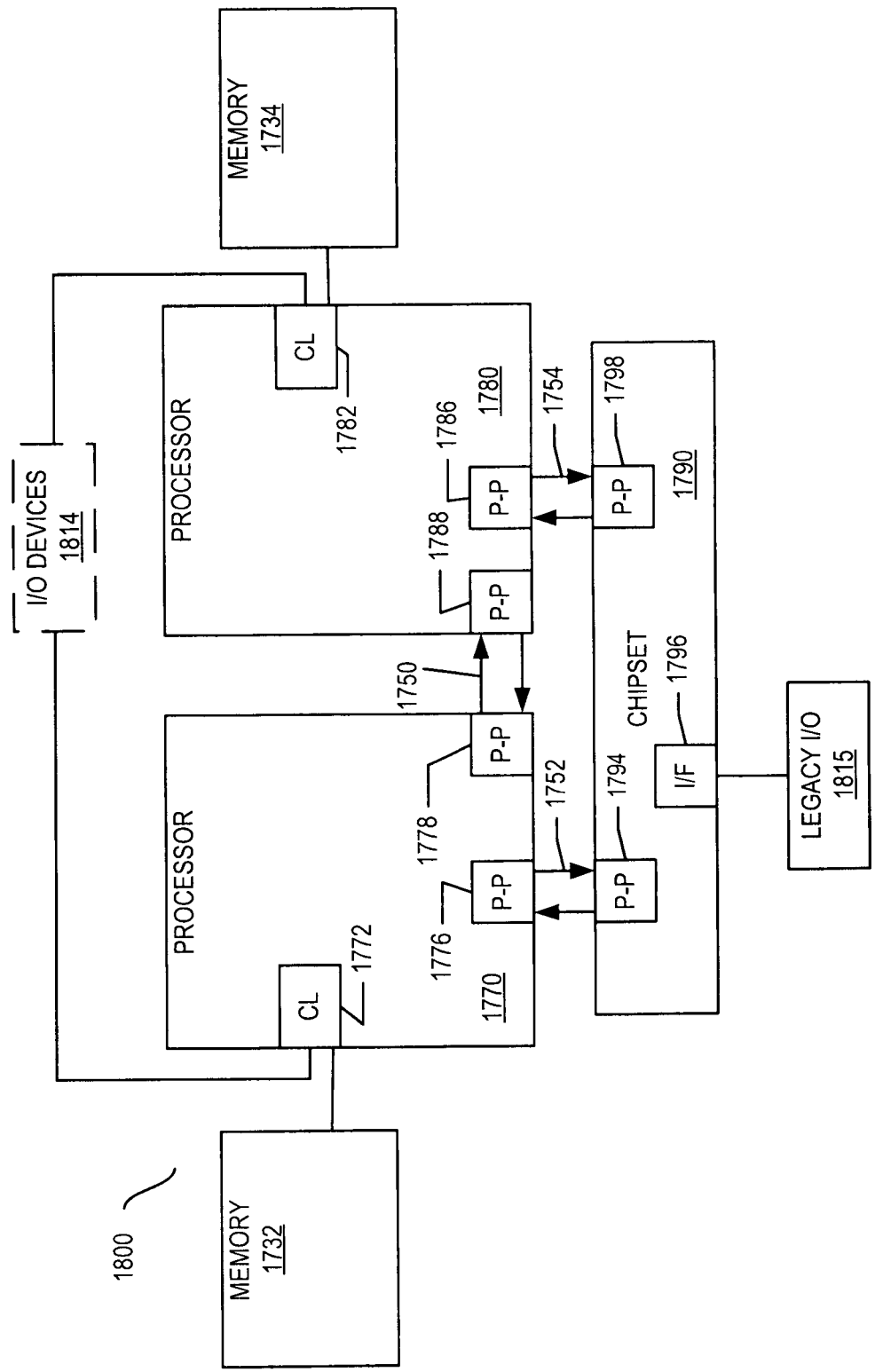

Referring now to FIG. 18, shown is a block diagram of a second more specific exemplary system 1800 in accordance with an embodiment of the present invention. Like elements in FIGS. 17 and 18 bear like reference numerals, and certain aspects of FIG. 17 have been omitted from FIG. 18 in order to avoid obscuring other aspects of FIG. 18.

FIG. 18 illustrates that the processors 1770, 1780 may include integrated memory and I/O control logic ("CL") 1772 and 1782, respectively. Thus, the CL 1772, 1782 include integrated memory controller units and include I/O control logic. FIG. 18 illustrates that not only are the memories 1732, 1734 coupled to the CL 1772, 1782, but also that I/O devices 1814 are also coupled to the control logic 1772, 1782. Legacy I/O devices 1815 are coupled to the chipset 1790.

Figure 19:
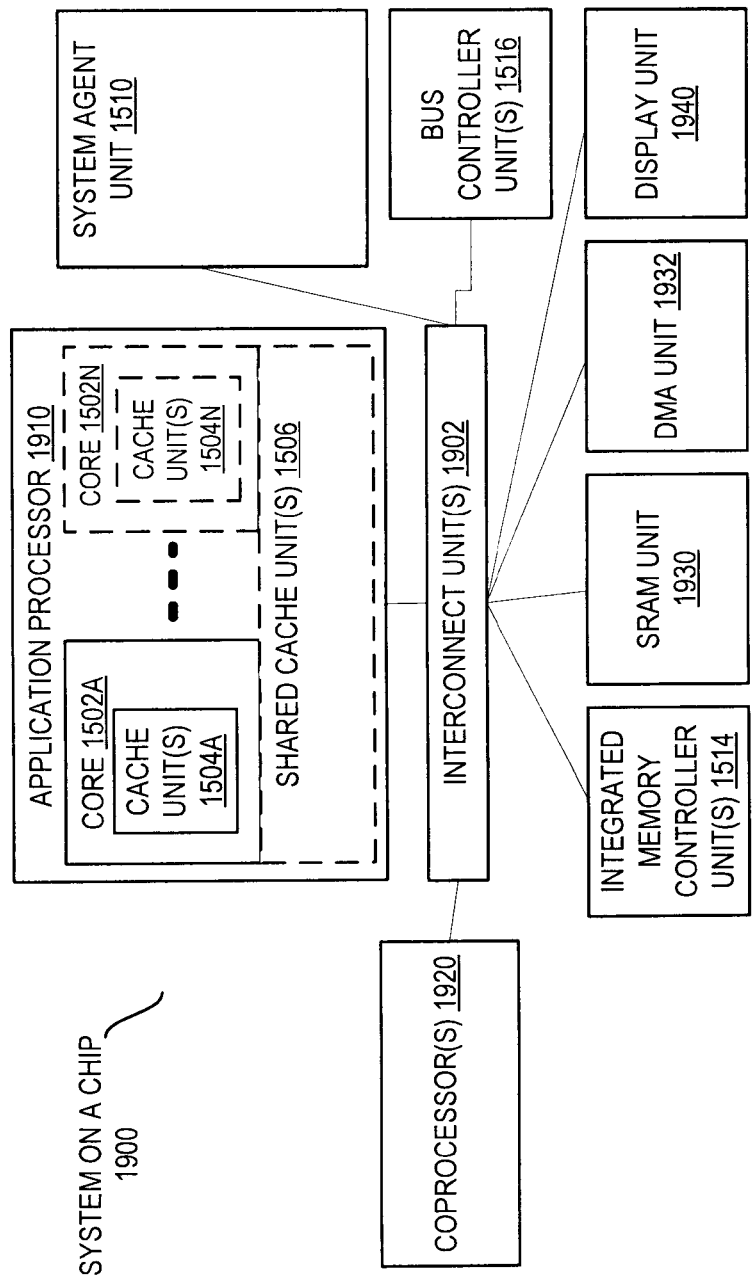

Referring now to FIG. 19, shown is a block diagram of a SoC 1900 in accordance with an embodiment of the present invention. Similar elements in FIG. 15 bear like reference numerals. Also, dashed lined boxes are optional features on more advanced SoCs. In FIG. 19, an interconnect unit(s) 1902 is coupled to: an application processor 1910 which includes a set of one or more cores 1502A-N, which include cache units 1504A-N, and shared cache unit(s) 1506; a system agent unit 1510; a bus controller unit(s) 1516; an integrated memory controller unit(s) 1514; a set or one or more coprocessors 1920 which may include integrated graphics logic, an image processor, an audio processor, and a video processor; an static random access memory (SRAM) unit 1930; a direct memory access (DMA) unit 1932; and a display unit 1940 for coupling to one or more external displays. In one embodiment, the coprocessor(s) 1920 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1730 illustrated in FIG. 17, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 20 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 20 shows a program in a high level language 2002 may be compiled using an x86 compiler 2004 to generate x86 binary code 2006 that may be natively executed by a processor with at least one x86 instruction set core 2016. The processor with at least one x86 instruction set core 2016 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 2004 represents a compiler that is operable to generate x86 binary code 2006 (e.g., object code) that can, with or without additional linkage processing, be executed on the processor with at least one x86 instruction set core 2016. Similarly, FIG. 20 shows the program in the high level language 2002 may be compiled using an alternative instruction set compiler 2008 to generate alternative instruction set binary code 2010 that may be natively executed by a processor without at least one x86 instruction set core 2014 (e.g., a processor with cores that execute the MIPS instruction set of MIPS Technologies of Sunnyvale, Calif. and/or that execute the ARM instruction set of ARM Holdings of Sunnyvale, Calif.). The instruction converter 2012 is used to convert the x86 binary code 2006 into code that may be natively executed by the processor without an x86 instruction set core 2014. This converted code is not likely to be the same as the alternative instruction set binary code 2010 because an instruction converter capable of this is difficult to make; however, the converted code will accomplish the general operation and be made up of instructions from the alternative instruction set. Thus, the instruction converter 2012 represents software, firmware, hardware, or a combination thereof that, through emulation, simulation or any other process, allows a processor or other electronic device that does not have an x86 instruction set processor or core to execute the x86 binary code 2006.

EXAMPLES

Example 1 is a processor. The processor includes a decode circuit to decode an instruction into a decoded instruction and an execution circuit to execute the decoded instruction to sum one or more values of one or more contiguous elements of an input vector that form a block to produce an accumulated value for the block and store the accumulated value for the block in a destination vector, where an input mask dictates the one or more contiguous elements of the input vector that form the block.

Example 2 includes the substance of example 1. In this example, the execution circuit is to sum one or more values of one or more other contiguous elements of the input vector that form a second block to produce an accumulated value for the second block and store the accumulated value for the second block in the destination vector, where the one or more other contiguous elements that form the second block are dictated by the input mask.

Example 3 includes the substance of example 1. In this example, the execution circuit is to process the one or more contiguous elements of the input vector from left to right.

Example 4 includes the substance of example 1. In this example, the execution circuit is to process the one or more contiguous elements of the input vector from right to left.

Example 5 includes the substance of example 1. In this example, the input vector is a vector containing all binary '1's.

Example 6 includes the substance of example 1. In this example, a bit of the input mask is set to binary '1' to indicate a border of the block.

Example 7 includes the substance of example 6. In this example, the execution circuit is to store the accumulated value for the block in an element of the destination vector corresponding to the bit of the input mask that is set to binary '1'.

Example 8 includes the substance of example 1. In this example, the execution circuit is to store the accumulated value for the block in the destination vector in a compressed manner.

Example 9 is a method performed by a processor. The method includes decoding an instruction into a decoded instruction and executing the decoded instruction to sum one or more values of one or more contiguous elements of an input vector that form a block to produce an accumulated value for the block and store the accumulated value for the block in a destination vector, where an input mask dictates the one or more contiguous elements of the input vector that form the block.

Example 10 includes the substance of example 9. In this example, the execution is to sum one or more values of one or more other contiguous elements of the input vector that form a second block to produce an accumulated value for the second block and store the accumulated value for the second block in the destination vector, where the one or more other contiguous elements that form the second block are dictated by the input mask.

Example 11 includes the substance of example 9. In this example, the execution is to process the one or more contiguous elements of the input vector from left to right.

Example 12 includes the substance of example 9. In this example, the execution is to process the one or more contiguous elements of the input vector from right to left.

Example 13 includes the substance of example 9. In this example, the input vector is a vector containing all binary '1's.

Example 14 includes the substance of example 9. In this example, a bit of the input mask is set to binary '1' to indicate a border of the block.

Example 15 includes the substance of example 14. In this example, the execution is to store the accumulated value for the block in an element of the destination vector corresponding to the bit of the input mask that is set to binary '1'.

Example 16 includes the substance of example 9. In this example, the execution is to store the accumulated value for the block in the destination vector in a compressed manner.

Example 17 is a non-transitory machine readable medium. The non-transitory machine readable medium has instruction stored therein, which when executed by a processor, causes the processor to decode an instruction into a decoded instruction and execute the decoded instruction to sum one or more values of one or more contiguous elements of an input vector that form a block to produce an accumulated value for the block and store the accumulated value for the block in a destination vector, where an input mask dictates the one or more contiguous elements of the input vector that form the block.

Example 18 includes the substance of example 17. In this example, the execution is to sum one or more values of one or more other contiguous elements of the input vector that form a second block to produce an accumulated value for the second block and store the accumulated value for the second block in the destination vector, where the one or more other contiguous elements that form the second block are dictated by the input mask.

Example 19 includes the substance of example 17. In this example, the execution is to process the one or more contiguous elements of the input vector from left to right.

Example 20 includes the substance of example 17. In this example, the execution is to process the one or more contiguous elements of the input vector from right to left.

Example 21 includes the substance of example 17. In this example, the input vector is a vector containing all binary '1's.

Example 22 includes the substance of example 17. In this example, a bit of the input mask is set to binary '1' to indicate a border of the block.

Example 23 includes the substance of example 22. In this example, the execution is to store the accumulated value for the block in an element of the destination vector corresponding to the bit of the input mask that is set to binary '1'.

Example 24 includes the substance of example 17. In this example, the execution is to store the accumulated value for the block in the destination vector in a compressed manner.

Example 25 is a hardware processor. The hardware processor includes a decoding means to decode an instruction into a decoded instruction and an executing means to execute the decoded instruction to sum one or more values of one or more contiguous elements of an input vector that form a block to produce an accumulated value for the block and store the accumulated value for the block in a destination vector, where an input mask dictates the one or more contiguous elements of the input vector that form the block.

Example 26 includes the substance of example 25. In this example, the executing means is to sum one or more values of one or more other contiguous elements of the input vector that form a second block to produce an accumulated value for the second block and store the accumulated value for the second block in the destination vector, where the one or more other contiguous elements that form the second block are dictated by the input mask.

Example 27 includes the substance of example 25. In this example, the executing means is to process the one or more contiguous elements of the input vector from left to right.

Example 28 includes the substance of example 25. In this example, the executing means is to process the one or more contiguous elements of the input vector from right to left.

Example 29 includes the substance of example 25. In this example, the input vector is a vector containing all binary '1's.

Example 30 includes the substance of example 25. In this example, a bit of the input mask is set to binary '1' to indicate a border of the block.

Example 31 includes the substance of example 30. In this example, the executing means is to store the accumulated value for the block in an element of the destination vector corresponding to the bit of the input mask that is set to binary '1'.

Example 32 includes the substance of example 25. In this example, the executing means is to store the accumulated value for the block in the destination vector in a compressed manner.

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A processor comprising:
    a decode circuit to decode an instruction into a decoded instruction; and
    an execution circuit to execute the decoded instruction to:
        sum one or more values of one or more contiguous elements of an input vector that form a block to produce an accumulated value for the block and store the accumulated value for the block in a destination vector, wherein an input mask dictates the one or more contiguous elements of the input vector that form the block, wherein the execution circuit is to store an accumulated value in each position of the destination vector that corresponds to a bit in the input mask that is set to binary '1' and store a masked out value in each position of the destination vector that corresponds to a bit in the input mask that is set to binary '0'.

2. The processor of claim 1, wherein the execution circuit is to sum one or more values of one or more other contiguous elements of the input vector that form a second block to produce an accumulated value for the second block and store the accumulated value for the second block in the destination vector, wherein the one or more other contiguous elements that form the second block are dictated by the input mask.

3. The processor of claim 1, wherein the input mask is to indicate a right border of the block.

4. The processor of claim 1, wherein the input mask is to indicate a left border of the block.

5. The processor of claim 1, wherein the input vector is a vector containing all binary '1's.

6. The processor of claim 1, wherein a bit of the input mask being set to binary '1' indicates that a position that corresponds to the bit of the input mask is a border of the block.

7. The processor of claim 6, wherein store the accumulated value for the block in a position of the destination vector that corresponds to the bit of the input mask that is set to binary '1'.

8. The processor of claim 1, wherein each masked value stored in the destination vector is a zero value.

9. A method performed by a processor comprising:
    decoding an instruction into a decoded instruction; and
    executing the decoded instruction to sum one or more values of one or more contiguous elements of an input vector that form a block to produce an accumulated value for the block and store the accumulated value for the block in a destination vector, wherein an input mask dictates the one or more contiguous elements of the input vector that form the block, wherein the execution stores an accumulated value in each position of the destination vector that corresponds to a bit in the input mask that is set to binary '1' and stores a masked out value in each position of the destination vector that corresponds to a bit in the input mask that is set to binary '0'.

10. The method of claim 9, wherein the execution is to sum one or more values of one or more other contiguous elements of the input vector that form a second block to produce an accumulated value for the second block and store the accumulated value for the second block in the destination vector, wherein the one or more other contiguous elements that form the second block are dictated by the input mask.

11. The method of claim 9, wherein the input mask is to indicate a right border of the block.

12. The method of claim 9, wherein the input mask is to indicate a left border of the block.

13. The method of claim 9, wherein the input vector is a vector containing all binary '1's.

14. The method of claim 9, wherein a bit of the input mask being set to binary '1' indicates that a position that corresponds to the bit of the input mask is a border of the block.

15. The method of claim 14, wherein the execution is to store the accumulated value for the block in a position of the destination vector corresponding to the bit of the input mask that is set to binary '1'.

16. The method of claim 9, wherein each masked value stored in the destination vector is a zero value.

17. A non-transitory machine readable medium having stored therein instructions, which when executed by a processor, causes the processor to:
decode an instruction into a decoded instruction; and
execute the decoded instruction to sum one or more values of one or more contiguous elements of an input vector that form a block to produce an accumulated value for the block and store the accumulated value for the block in a destination vector, wherein an input mask dictates the one or more contiguous elements of the input vector that form the block, wherein the execution stores an accumulated value in each position of the destination vector that corresponds to a bit in the input mask that is set to binary '1' and stores a masked out value in each position of the destination vector that corresponds to a bit in the input mask that is set to binary '0'.

18. The non-transitory machine readable medium of claim 17, wherein the execution is to sum one or more values of one or more other contiguous elements of the input vector that form a second block to produce an accumulated value for the second block and store the accumulated value for the second block in the destination vector, wherein the one or more other contiguous elements that form the second block are dictated by the input mask.

19. The non-transitory machine readable medium of claim 17, wherein the input mask is to indicate a right border of the block.

20. The non-transitory machine readable medium of claim 17, wherein the input vector is a vector containing all binary '1's.

21. The non-transitory machine readable medium of claim 17, wherein a bit of the input mask being set to binary '1' indicates that a position that corresponds to the bit of the input mask is a border of the block.

22. The non-transitory machine readable medium of claim 21, wherein the execution is to store the accumulated value for the block in a position of the destination vector that corresponds to the bit of the input mask that is set to binary '1'.

23. The non-transitory machine readable medium of claim 17, wherein each masked value stored in the destination vector is a zero value.

\* \* \* \* \*